United States Patent
Nogi et al.

(10) Patent No.: US 7,888,180 B2
(45) Date of Patent: *Feb. 15, 2011

(54) SEMICONDUCTOR APPARATUS HAVING A FIRST AND A SECOND PROJECTION PORTION ON OPPOSITE SURFACES OF A SEMICONDUCTOR WAFER AND METHOD FOR MANUFACTURING THE SAME

(75) Inventors: Takao Nogi, Hyogo-ken (JP); Kentaro Suga, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

This patent is subject to a terminal disclaimer.

(21) Appl. No.: 12/130,110

(22) Filed: May 30, 2008

(65) Prior Publication Data

US 2008/0296760 A1      Dec. 4, 2008

(30) Foreign Application Priority Data

May 30, 2007     (JP) .............................. 2007-143078

(51) Int. Cl.
    H01L 21/78    (2006.01)
(52) U.S. Cl. ............................... 438/114; 257/E21.238
(58) Field of Classification Search ................. 438/114, 438/127; 258/737–738, 779, 782, E21.238
    See application file for complete search history.

(56) References Cited

U.S. PATENT DOCUMENTS

| | | | |
|---|---|---|---|
| 6,774,492 B2 | | 8/2004 | Ahn et al. |
| 7,316,937 B2 * | | 1/2008 | Kojima et al. .................. 438/60 |
| 7,380,333 B2 * | | 6/2008 | Tsukada et al. ............. 29/610.1 |
| 7,405,100 B1 * | | 7/2008 | Mostafazadeh et al. ........ 438/68 |
| 7,696,009 B2 * | | 4/2010 | Terui et al. .................... 438/113 |
| 2005/0227415 A1 * | | 10/2005 | Farnworth et al. ........... 438/114 |
| 2008/0220568 A1 * | | 9/2008 | Muto et al. .................. 438/127 |

FOREIGN PATENT DOCUMENTS

| | | |
|---|---|---|
| JP | 5-347324 | 12/1993 |
| JP | 10-190062 | 7/1998 |
| JP | 11-204835 | 7/1999 |

(Continued)

OTHER PUBLICATIONS

U.S. Appl. No. 12/694,534, filed Jan. 27, 2010, Nogi et al.

*Primary Examiner*—Nathan W Ha
(74) *Attorney, Agent, or Firm*—Oblon, Spivak, McClelland, Maier & Neustadt, L.L.P.

(57) ABSTRACT

A semiconductor apparatus includes a semiconductor device having electrodes on its opposed frontside and backside, respectively, a first external electrode connected to the electrode at the frontside, the first external electrode having a first major surface generally parallel to the frontside of the semiconductor device, and a first side surface generally perpendicular to the first major surface, and a second external electrode having a second major surface generally parallel to the backside of the semiconductor device, a second side surface generally perpendicular to the second major surface, and a projection protruding perpendicular to the second major surface and connected to the electrode at the backside, The first side surface of the first external electrode and the second side surface of the second external electrode serve as mount surfaces. The semiconductor device is located between the first external electrode and the second external electrode.

20 Claims, 27 Drawing Sheets

FOREIGN PATENT DOCUMENTS

| | | |
|---|---|---|
| JP | 2000-252235 | 9/2000 |
| JP | 2001-94025 | 4/2001 |
| JP | 2003-197840 | 7/2003 |
| JP | 2004-273997 | 9/2004 |
| JP | 2006-253360 | 9/2006 |
| JP | 2007-194376 | 8/2007 |

* cited by examiner

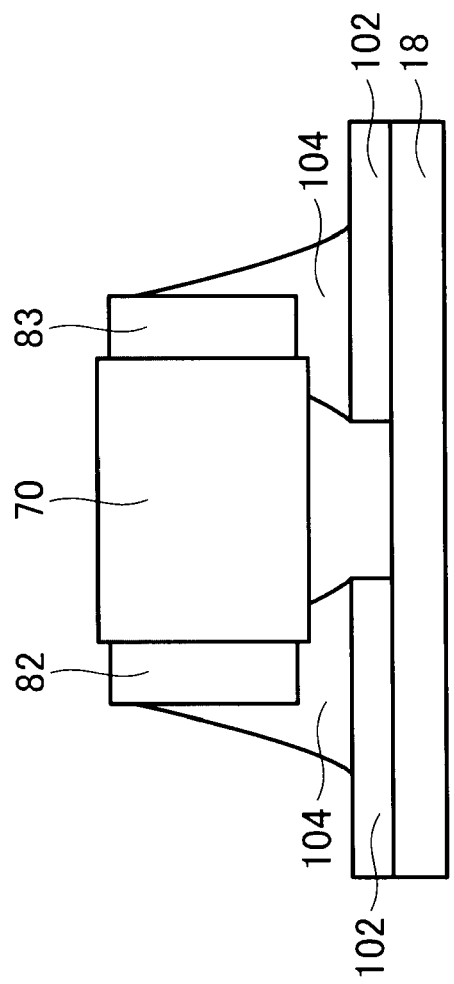
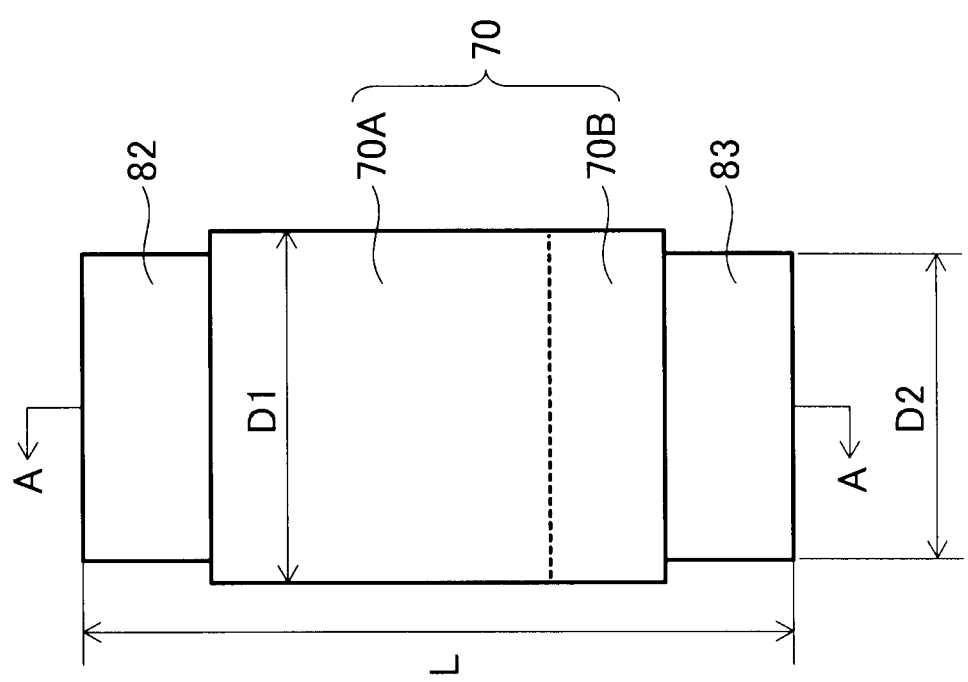
FIG. 19C
FIG. 19D

SEMICONDUCTOR APPARATUS HAVING A FIRST AND A SECOND PROJECTION PORTION ON OPPOSITE SURFACES OF A SEMICONDUCTOR WAFER AND METHOD FOR MANUFACTURING THE SAME

CROSS-REFERENCE TO RELATED APPLICATIONS

This application is based upon and claims the benefit of priority from the prior Japanese Patent Application No. 2007-143078, filed on May 30, 2007; the entire contents of which are incorporated herein by reference.

BACKGROUND OF THE INVENTION

1. Field of the Invention

This invention relates to a semiconductor apparatus and a method for manufacturing the same.

2. Background Art

A semiconductor package including a metal block for source wire bonding attached to a Cu substrate is conventionally known (see, e.g., JP 5-347324A (1993), hereinafter referred to as Patent Document 1).

However, the semiconductor apparatus disclosed in Patent Document 1 requires bonding wires. Hence, there is a problem of upsizing the semiconductor apparatus as a whole, as well as increasing the number of manufacturing steps and raising the cost.

In another conventionally known semiconductor apparatus including a semiconductor device, a bump with a wire extracted therefrom is placed on a first major surface of the semiconductor device. The semiconductor device is in contact with a first metal electrode via a first conductor at the surface opposite to the first major surface, and is covered with an insulator on the outer side surface. The wire extracted from the bump is connected to a second metal electrode via a second conductor (see, e.g., JP 2000-252235A, hereinafter referred to as Patent Document 2).

However, in the semiconductor apparatus disclosed in Patent Document 2, the semiconductor device is not placed at the center of the semiconductor apparatus, but on the first metal electrode side. This causes a problem of large impact on the semiconductor device at the time of transferring the semiconductor apparatus. Furthermore, the above conductor is composed of conductive resin or high melting point solder, and the above metal electrode is composed of Al, Cu, Au, or an alloy containing them. Hence, there is a problem of upsizing the semiconductor apparatus as a whole and raising the cost.

SUMMARY OF THE INVENTION

According to an aspect of the invention, there is provided a semiconductor apparatus including: a semiconductor device having electrodes on its opposed frontside and backside, respectively; a first external electrode connected to the electrode at the frontside, the first external electrode having a first major surface generally parallel to the frontside of the semiconductor device, and a first side surface generally perpendicular to the first major surface; and a second external electrode having a second major surface generally parallel to the backside of the semiconductor device, a second side surface generally perpendicular to the second major surface, and a projection protruding perpendicular to the second major surface and connected to the electrode at the backside, the first side surface of the first external electrode and the second side surface of the second external electrode serving as mount surfaces, and the semiconductor device being located between the first external electrode and the second external electrode.

According to an aspect of the invention, there is provided a method for manufacturing semiconductor apparatus including: forming a first projection made of conductive material on electrode of semiconductor device, the electrode being formed on a front surface of a semiconductor wafer; forming a first groove between the semiconductor devices on the front surface of the semiconductor wafer; forming a first sealing portion by filling the first groove and a gap between the first projections with insulating material; polishing a back surface of the semiconductor wafer; forming a second projection made of conductive material on the back surface of the semiconductor wafer, the second projection being connected to the semiconductor device; forming a second sealing portion by filling a gap between the second projections by insulating material; forming a first lead made of conductive material on the first projection; forming a second lead made of conductive material on the second projection; and separating the semiconductor devices by cutting the first and second sealing portions between the semiconductor devices.

According to an aspect of the invention, there is provided a method for manufacturing semiconductor apparatus including: forming a first projection made of conductive material on an electrode of a semiconductor device, the electrode being formed on a front surface of a semiconductor wafer; forming a first sealing portion by covering the first projection with insulating material on the front surface of the semiconductor wafer; forming a second projection made of conductive material on a back surface of the semiconductor wafer, the second projection being connected to the semiconductor device; separating the semiconductor devices by forming a first groove from the back surface of the semiconductor wafer between the semiconductor devices, the first groove reaching the first sealing portion, forming a second sealing portion by filling the first groove and by covering the second projection by insulating material; exposing the first projection by polishing a surface of the first sealing portion; exposing the second projection by polishing a surface of the second sealing portion; separating the semiconductor apparatuses by cutting the first and second sealing portions between the semiconductor devices.

BRIEF DESCRIPTION OF THE DRAWINGS

FIGS. 7A through 8C are process cross-sectional views showing a process for manufacturing the semiconductor apparatus 10 of the third embodiment.

FIG. 19C is a planar view showing a semiconductor apparatus of another example of the seventh embodiment.

FIG. 19D is a side view showing a semiconductor apparatus of the example of the seventh embodiment.

DETAILED DESCRIPTION OF THE INVENTION

Embodiments of the invention will now be described in detail with reference to the drawings.

Figure 1:
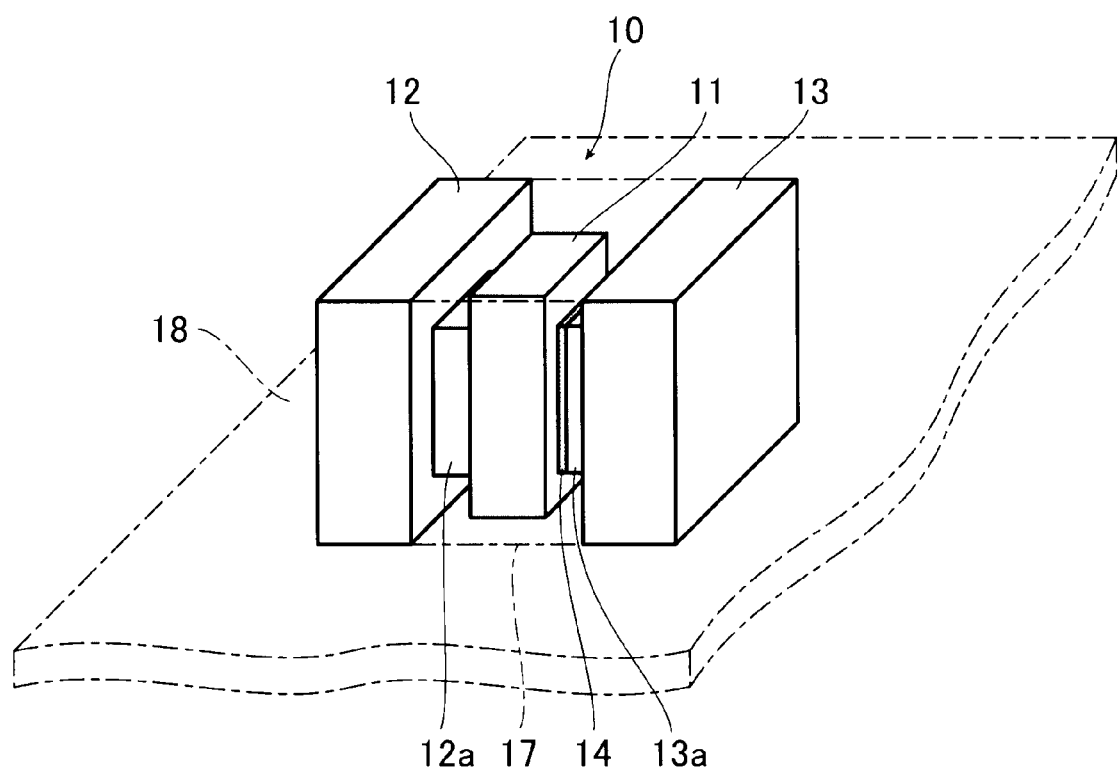
FIG. 1 is a perspective view of a semiconductor apparatus according to a first embodiment of the invention, which is mounted on a substrate.

FIG. 1 is a perspective view of a semiconductor apparatus according to a first embodiment of the invention, which is mounted on a substrate.

In this figure, the semiconductor apparatus 10 comprises a semiconductor device 11 placed at the center, and a first external electrode 12 and a second external electrode 13, which face the frontside and the backside of the semiconductor device 11 and are made of copper or other metal blocks. The semiconductor device 11 is illustratively a diode shaped like a square chip, and has input/output electrodes 15, 16 (see FIG. 2) on its frontside and backside. Each external electrode 12, 13 is shaped like a block with a generally square major surface. Projections 12a, 13a are formed at the center of the respective major surfaces on the semiconductor device 11 side.

The projections 12a, 13a are mechanically fixed to the semiconductor device 11 via a conductive adhesive 14, and the first external electrode 12 and the second external electrode 13 are electrically connected to the electrodes 15, 16 provided on the frontside and the backside of the semiconductor device 11 via the adhesive 14. The external electrodes 12, 13 are larger in area than the semiconductor device 11 so that the semiconductor device 11 does not protrude beyond the outer periphery of the external electrodes 12, 13. Preferably, the projections 12a, 13a are slightly smaller in area than the electrodes 15, 16 of the semiconductor device 11 so as not to lie off the electrodes 15, 16. The adhesive 14 is suitably made of an alloy solder, or a paste containing metal fillers, for example.

A sealing portion 17 is provided between the semiconductor device 11 and each of the first external electrode 12 and the second external electrode 13 so as to cover the respective projections 12a, 13a and the semiconductor device 11. The sealing material of the sealing portion 17 can be an insulating material such as resin, glass, and ceramics. The surface of each external electrode 12, 13 is plated as needed so that the external electrodes 12, 13 can be directly mounted on the substrate 18 serving as a mounting member. That is, the side surface of the external electrodes 12, 13 serves as a mounting surface of the semiconductor apparatus 10. If the major surface of the external electrodes 12, 13 is shaped into a square, any position on the four side surfaces of the external electrodes 12, 13 can be used for mounting, thus improving mountability.

Furthermore, as described above, the semiconductor device 11 is placed at the center of the semiconductor apparatus 10. Hence the external electrodes 12, 13 receive the impact occurring at the time of transferring the semiconductor apparatus 10, and the impact on the semiconductor device 11 can be reduced.

FIG. 2 shows a process for manufacturing the semiconductor apparatus 10 of the first embodiment.

Figure 2A:
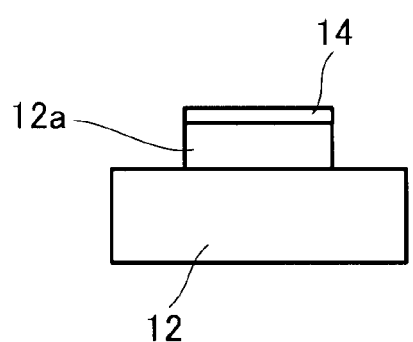
FIGS. 2A through 2D show a process for manufacturing the semiconductor apparatus 10 of the first embodiment.

As shown in FIG. 2A, a first external electrode 12 is placed on a table with its projection 12a facing upward, and an adhesive 14 is applied to the surface of the projection 12a. Typically, a plurality of semiconductor apparatuses are simultaneously manufactured, and hence a plurality of external electrodes 12 are arrayed. However, only one external electrode is illustratively described herein.

Figure 2B:
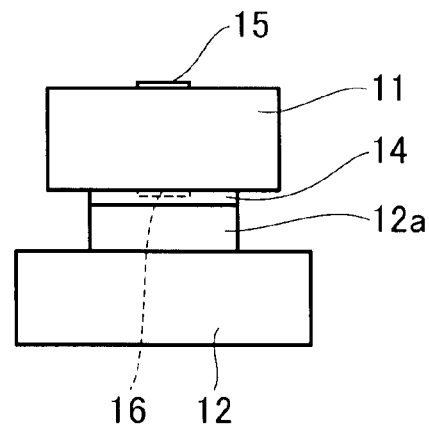

Next, as shown in FIG. 2B, the semiconductor device 11 is placed on top of the adhesive 14.

Figure 2C:
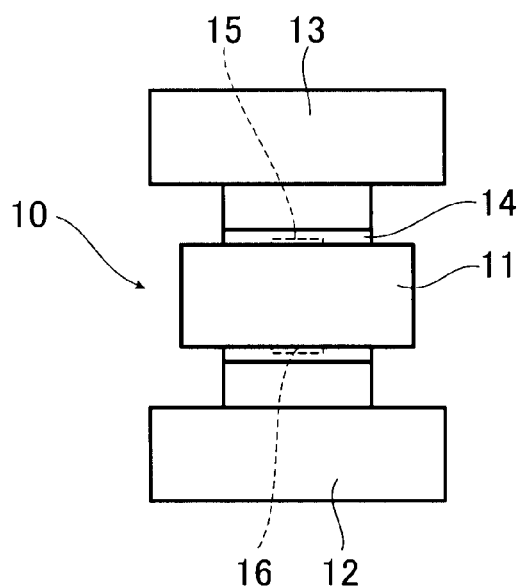

Next, an adhesive 14 is applied to the surface of the projection 13a of a second external electrode 13, which is placed on top of the semiconductor device 11 as shown in FIG. 2C. Next, the adhesive 14 is solidified to fix the semiconductor device 11 to the external electrodes 12, 13. The method for solidifying the adhesive 14 is optimally selected in accordance with the type of the adhesive 14 from among entirely increasing the temperature, applying load from above, and applying vibration, for example. Thus a semiconductor apparatus 10 is formed in which the external electrodes 12, 13 are mechanically fixed to both sides of the semiconductor device 11, and are electrically connected to the electrodes 15, 16 of the semiconductor device 11.

Figure 2D:
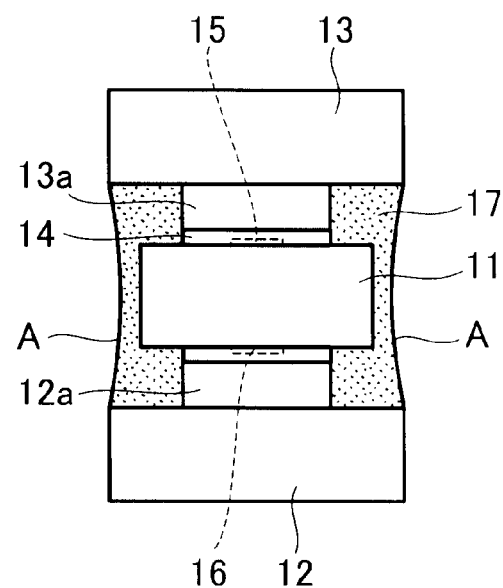

Next, the periphery of the space to be provided with a sealing portion 17 (see FIG. 1) is surface treated by an atomic beam, ion beam, or plasma, or chemically cleaned. Then, as shown in FIG. 2D, a sealing portion 17 is formed. The sealing portion 17 can be formed by injecting a viscous sealing material composed of resin, glass, or ceramics, for example, onto the periphery of the semiconductor device 11 using a dispenser equipped with an injection nozzle, thereby achieving sealing by surface tension (portion A) without involving bubbles. This sealing method can reduce the facility cost because it does not need a mold. Thus a packaged semiconductor apparatus 10 sealed with the sealing portion 17 as shown in FIG. 1 is obtained. At this time, the surface of the injected sealing material is recessed concavely as shown in FIG. 2D. This can prevent the sealing portion 17 from interfering with the substrate 18 at the time of mounting on the substrate 18 as shown in FIG. 1.

Figure 3:
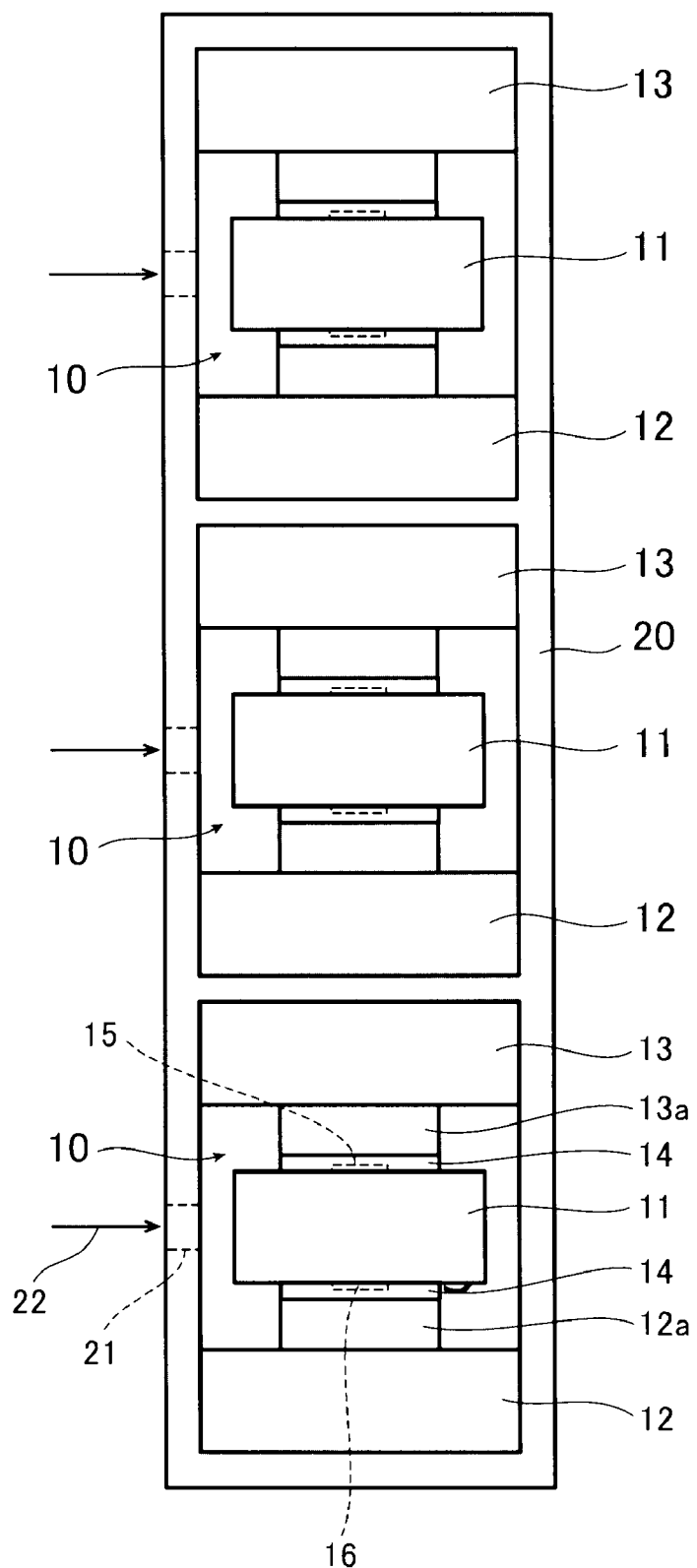
FIG. 3 shows an example of sealing using a mold.

FIG. 3 shows an example of sealing using a mold.

As shown in FIG. 3, the semiconductor apparatus 10 is placed in a mold 20, and the sealing material is injected from the injection port 21 as indicated by the arrow 22. When a plurality of semiconductor apparatuses 10 are simultaneously fabricated, the semiconductor apparatuses 10 are arrayed in the mold 20, and the sealing material is injected from each injection port 21. Thus a packaged semiconductor apparatus 10 sealed with the sealing portion 17 as shown in FIG. 1 is obtained. This sealing method can manufacture numerous semiconductor apparatuses in a short time by sealing a plurality of semiconductor apparatuses 10 placed in the mold 20.

In the above embodiment, the external electrodes 12, 13 are provided with the projections 12a, 13a so that projections 12a, 13a are bonded to the semiconductor device 11. Thus the external electrodes 12, 13 can be spaced from each other to some extent to provide space for the sealing portion 17. However, the external electrodes 12, 13 can have a flat major surface without projections 12a, 13a and can be directly bonded to the semiconductor device 11, and this structure is also encompassed within the scope of the invention.

Figure 4:
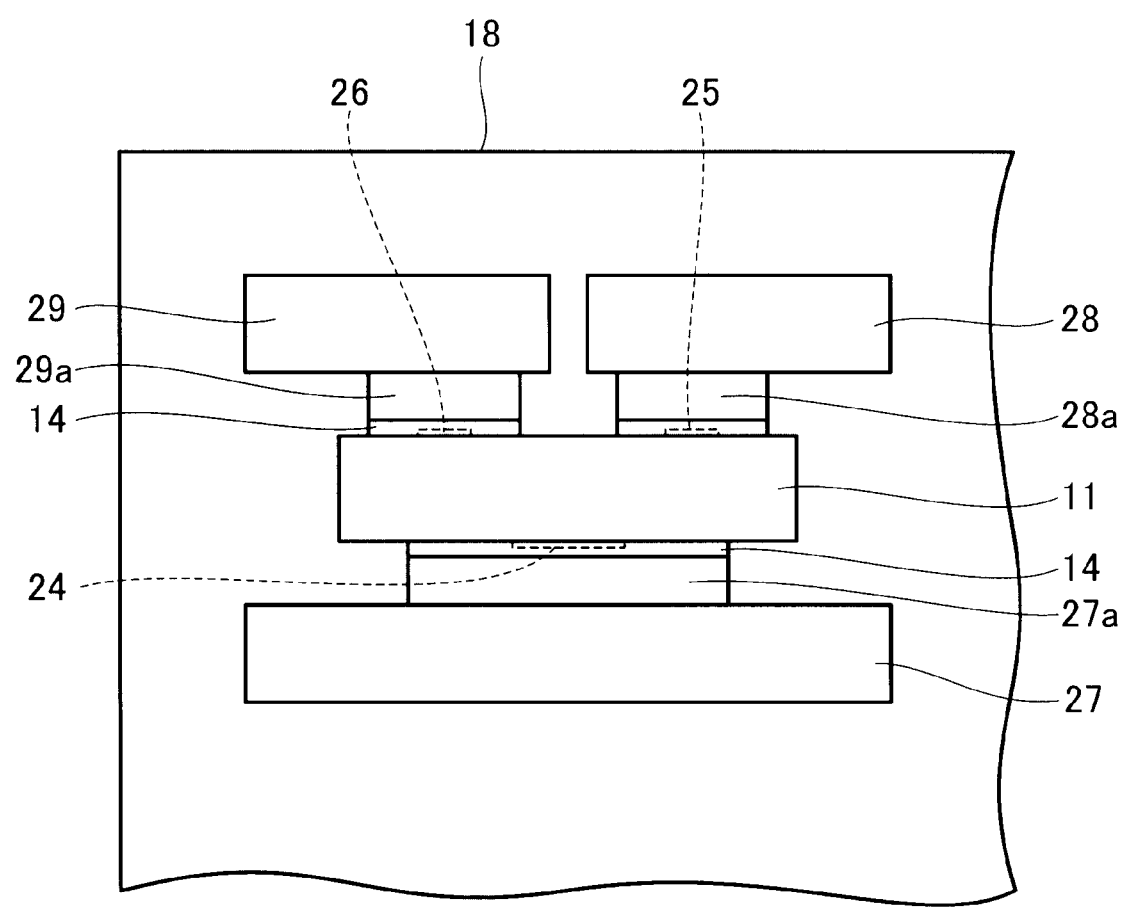
FIG. 4 is a plan view of a semiconductor apparatus according to a second embodiment, where a semiconductor device 11 is illustratively a transistor having three electrodes.

FIG. 4 is a plan view of a semiconductor apparatus according to a second embodiment, where a semiconductor device 11 is illustratively a transistor having three electrodes.

More specifically, FIG. 4 is a schematic view of the semiconductor apparatus mounted on a substrate 18 as viewed from above. The semiconductor device 11 is a transistor having a drain electrode 24 at one surface, and a gate electrode 25 and a source electrode 26 at the other surface. As shown in this figure, on the drain electrode 24 side, the projection 27a of a first external electrode 27 is bonded via an adhesive 14. On the surface of the gate electrode 25 and source electrode 26 side, the projection 28a of a second external electrode 28 is bonded and electrically connected to the gate electrode 25, and the projection 29a of a third external electrode 29 is bonded and electrically connected to the source electrode 26. The side surfaces, or mounting surfaces, of the external electrodes 27, 28, 29 are coplanar, and can be bonded to the substrate 18 for mounting. It is noted that, although not shown, the periphery of the semiconductor device 11 can be sealed as in the first embodiment.

Figure 5:
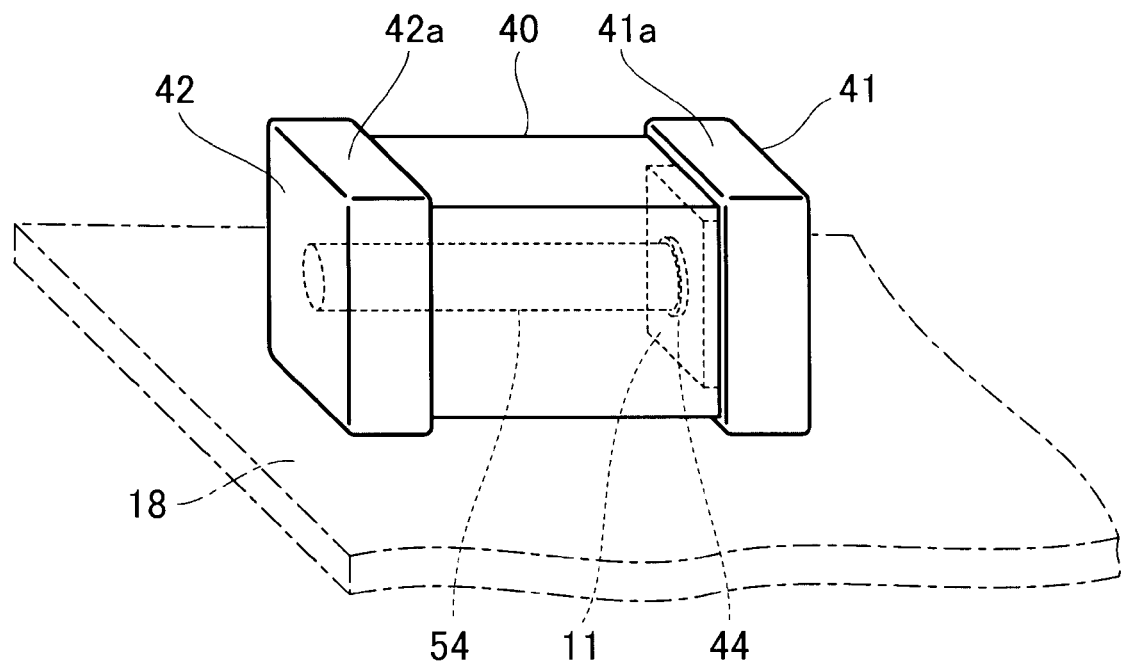
FIG. 5 is a perspective view of a semiconductor apparatus according to a third embodiment.

FIG. 5 is a perspective view of a semiconductor apparatus according to a third embodiment.

Figure 6:
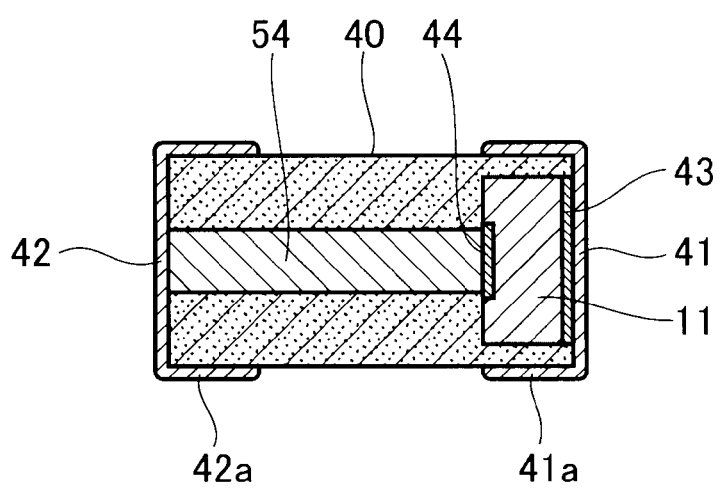
FIG. 6 is a longitudinal cross-sectional view of the semiconductor apparatus of this embodiment.

FIG. 6 is a longitudinal cross-sectional view of the semiconductor apparatus of this embodiment.

The semiconductor apparatus of the third embodiment comprises a semiconductor device 11 having electrodes 43, 44 on both sides, a sealing portion 40 protruding from one side (referred to as "backside" for convenience) of the semiconductor device 11, a first external electrode 41 made of a cap-like electrode film provided on the other side (referred to as "frontside" for convenience) of the semiconductor device 11, and a second external electrode 42 made of a cap-like electrode film provided on the tip surface of the sealing portion 40 opposite to the semiconductor device 11.

A conductive portion (projection) 54 connected to the second electrode 44 on the backside of the semiconductor device 11 is provided at the center of the sealing portion 40. The second external electrode 42 has a major surface connected to the tip surface of the conductive portion 54 and a bent side surface 42a extending on the outer periphery of the sealing portion 40. The first external electrode 41 has a major surface connected to the first electrode 43 and a bent side surface 41a extending on the outer periphery of the sealing portion 40. The external electrodes 41, 42 are illustratively made of copper foil, and illustratively plated with gold for mounting on the substrate 18. The semiconductor apparatus of this embodiment is mounted on the substrate 18 at the side surface 41a, 42a of the external electrodes 41, 42, that is, at the portion extending on the outer periphery of the sealing portion 40.

FIGS. 7 and 8 are process cross-sectional views showing a process for manufacturing the semiconductor apparatus 10 of the third embodiment.

Figure 7A:
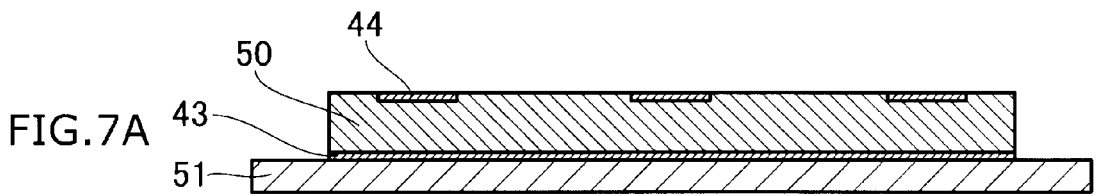

As shown in FIG. 7A, a first electrode 43 is provided on the lower surface of a long plate-like wafer 50 throughout the length thereof. A second electrode 44 is provided on the upper surface of the wafer 50 at a position corresponding to each semiconductor device. The electrodes 43, 44 are illustratively made of gold, silver, or nickel. The wafer 50 is stuck onto a fixing sheet 51 via the first electrode 43. The fixing sheet 51 is illustratively a dicing sheet that sucks the wafer 50 and releases the suction by ultraviolet irradiation or heating.

Figure 7B:
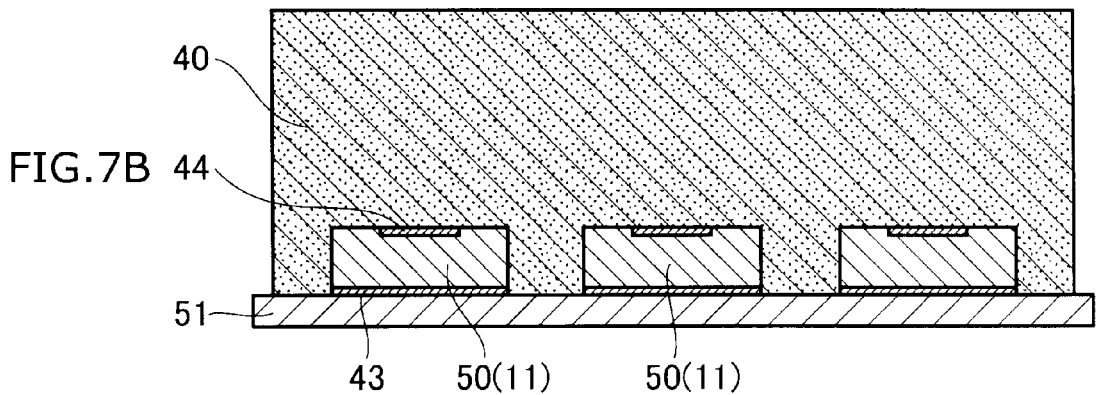

Next, as shown in FIG. 7B, the wafer 50 is cut by a dicing blade (not shown) or the like into individual semiconductor devices 11, which are then entirely sealed with resin or other sealing material to form a sealing portion 40.

Figure 7C:
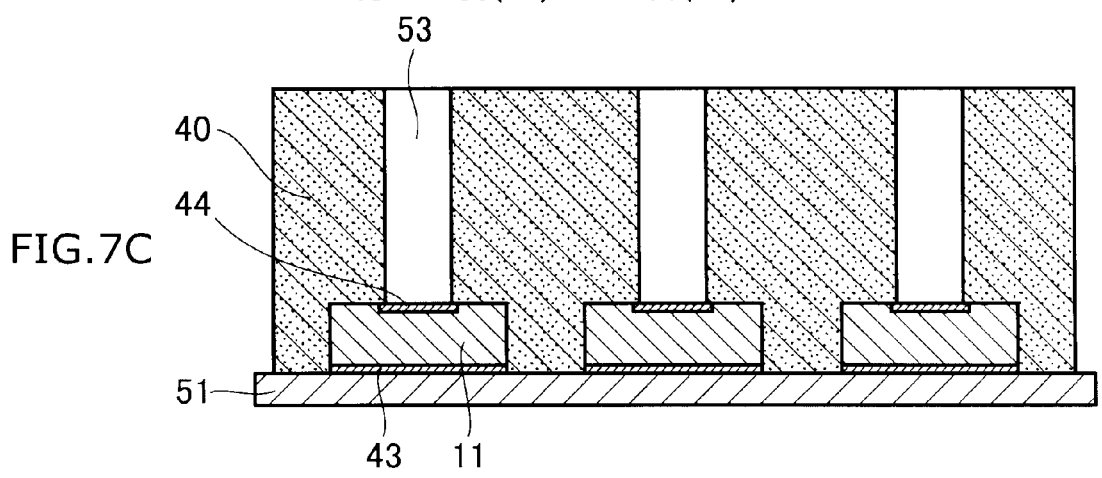

Next, as shown in FIG. 7C, the position of the sealing portion 40 corresponding to the second electrode 44 is bored by laser or the like to form a hole 53.

Figure 7D:
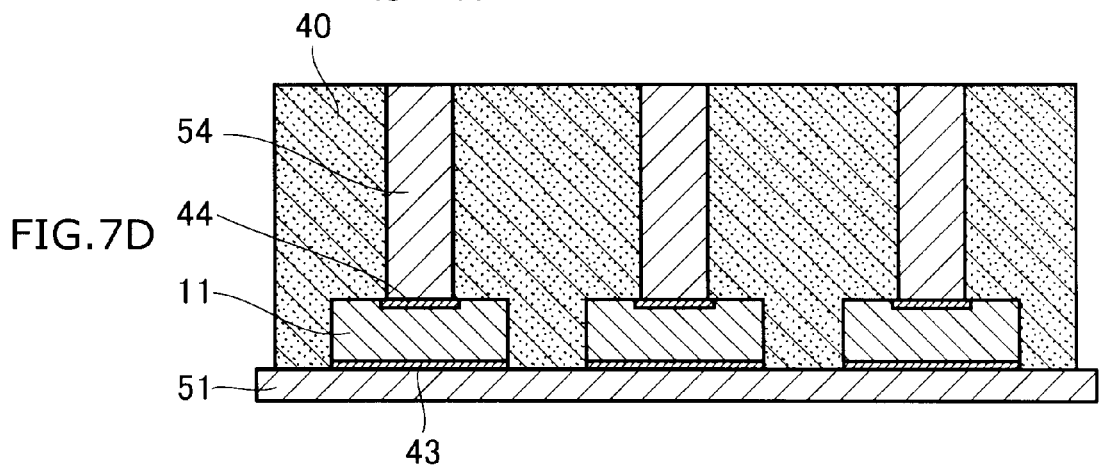

Next, as shown in FIG. 7D, a conductive material such as a conductive paste is injected into the hole 53 to form a conductive portion 54. The lower end of the conductive portion 54 is connected to the second electrode 44, and the upper end surface is generally coplanar with the end surface of the sealing portion 40.

Here, the manufacturing process from FIGS. 7A to 7D is different from the manufacturing process as disclosed in the above-mentioned Patent Document 2, where a wafer 50 is cut by a dicing blade (not shown) or the like, a conductive portion 54 (e.g., a wire bonded to the electrode via a bump) is formed on the second electrode 44, and then the semiconductor device 11 including the conductive portion 54 is entirely sealed with resin or other sealing material.

Figures 8A, 8B, 8C:
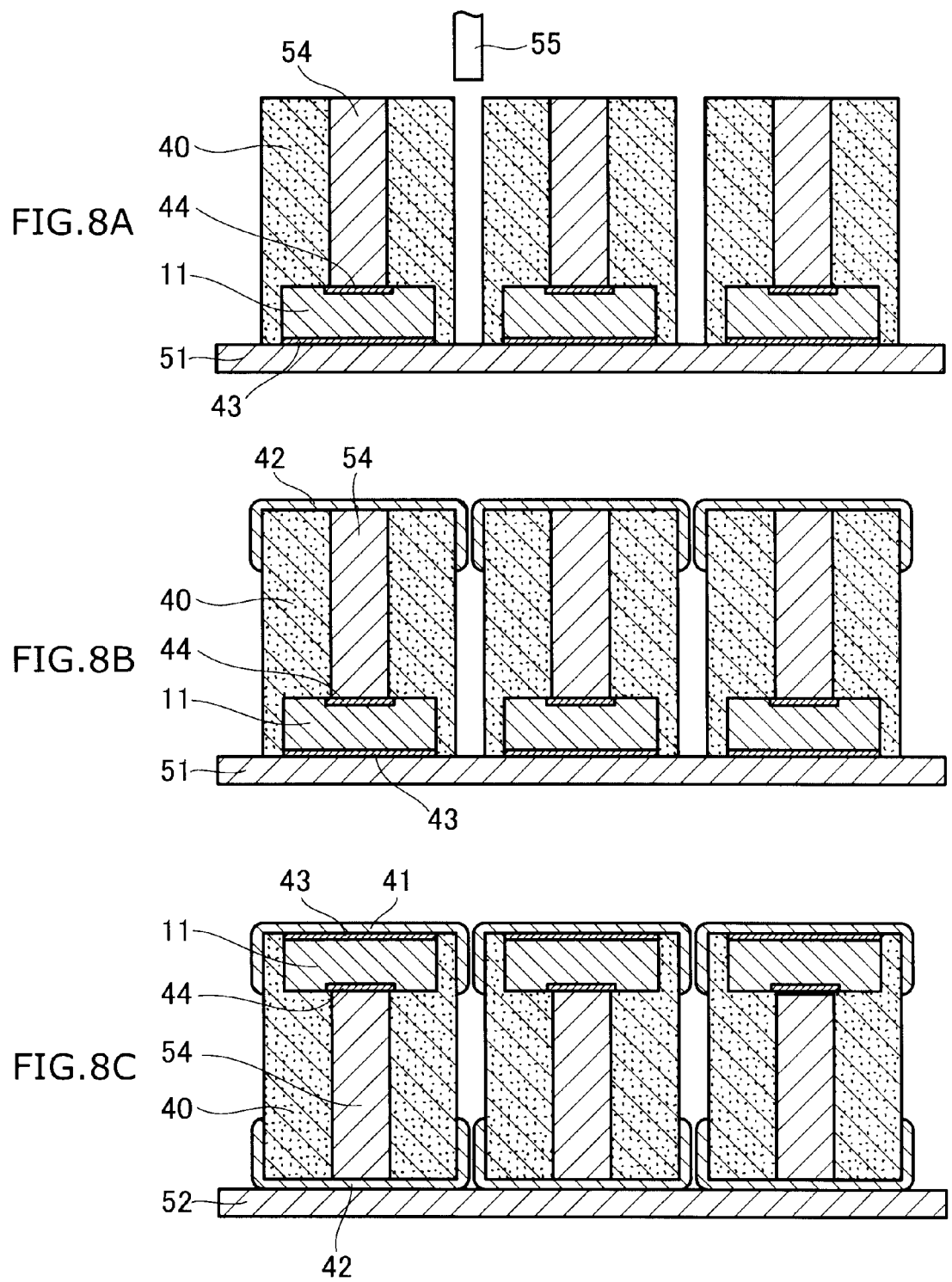

Next, as shown in FIG. 8A, the sealing portion 40 is cut by a dicing blade 55 or the like into individual semiconductor devices 11.

Next, as shown in FIG. 8B, by using copper foil or the like, a second external electrode 42 made of a cap-like electrode film is formed at the end of the sealing portion 40. The surface of the external electrode 42 can be plated with gold or the like.

Next, as shown in FIG. 8C, the workpiece is inverted to bring the fixing sheet 51 on top so that the semiconductor device 11 is located on the upside, and it is stuck onto another fixing sheet 52 via the second electrode 42. Then the upper fixing sheet 51 is removed, and a first external electrode 41 made of a cap-like electrode film is formed on the semiconductor device 11. Thus a semiconductor apparatus as shown in FIGS. 5 and 6 is completed.

In the semiconductor apparatus as shown in FIGS. 5 and 6, the external electrode 41, 42 is made of a cap-like electrode film without using an electrode plate and an electrode block. Thus the semiconductor apparatus can be downsized, and the material cost and the manufacturing cost can be reduced.

FIGS. 9 and 10 are process cross-sectional views showing an alternative process for manufacturing the semiconductor apparatus 10 of this embodiment.

Figure 9A:
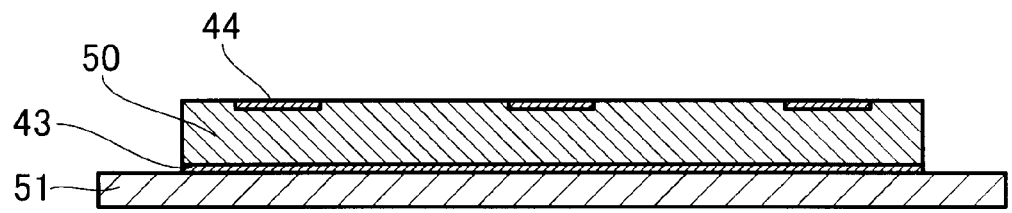
FIGS. 9A through 10C are process cross-sectional views showing an alternative process for manufacturing the semiconductor apparatus 10 of this embodiment.
Figure 9B:
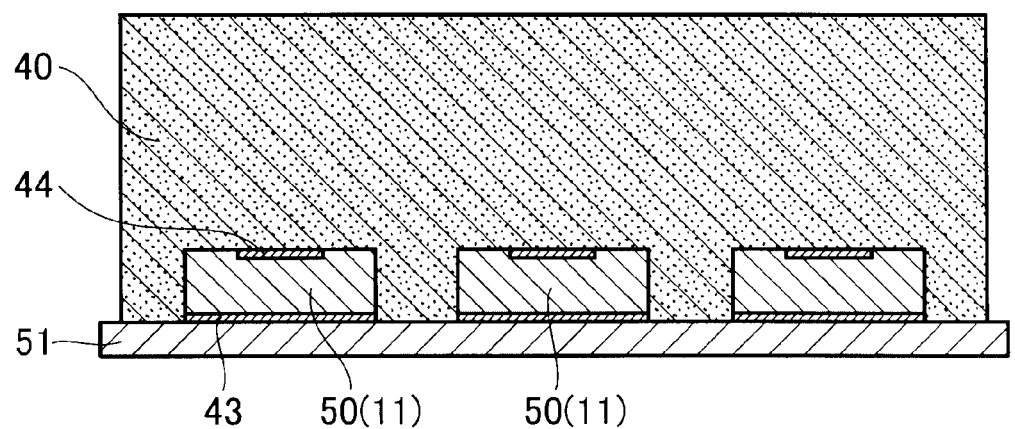
Figure 9C:
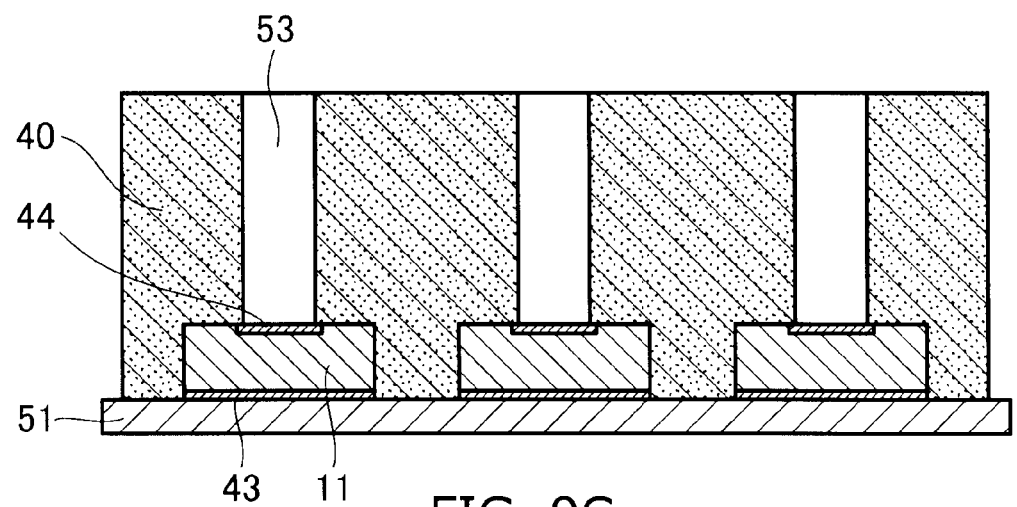
Figure 10A:
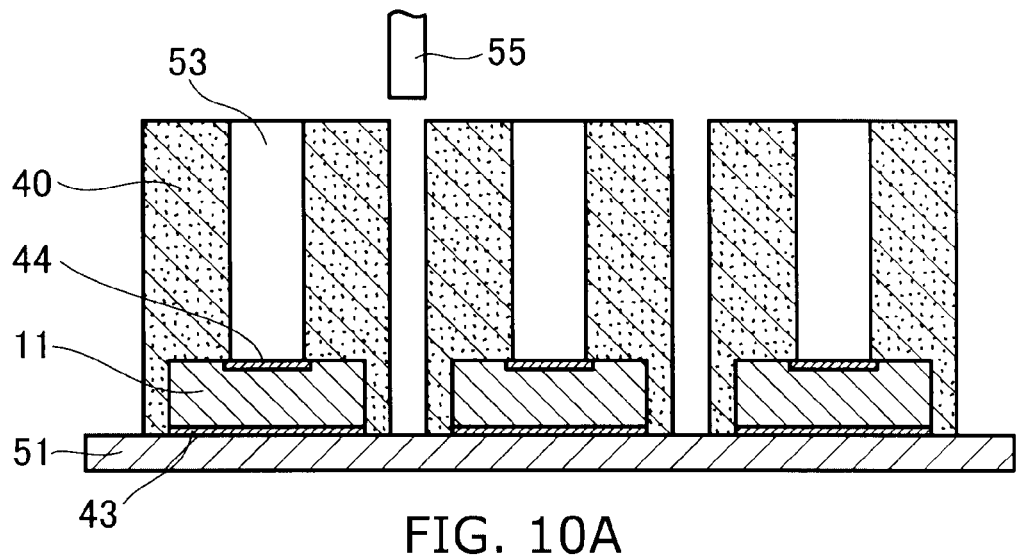

The manufacturing steps of FIGS. 9A to 9C are the same as the manufacturing steps of FIGS. 7A to 7C, and hence the description of these manufacturing steps is omitted here.

In the manufacturing step of FIG. 7D, a conductive material such as a conductive paste is injected into the hole 53 to form a conductive portion 54. In contrast, in the manufacturing step of FIG. 10A, nothing is injected into the hole 53, and the sealing portion 40 is cut by a dicing blade 55 or the like into individual semiconductor devices 11.

Figure 10B:
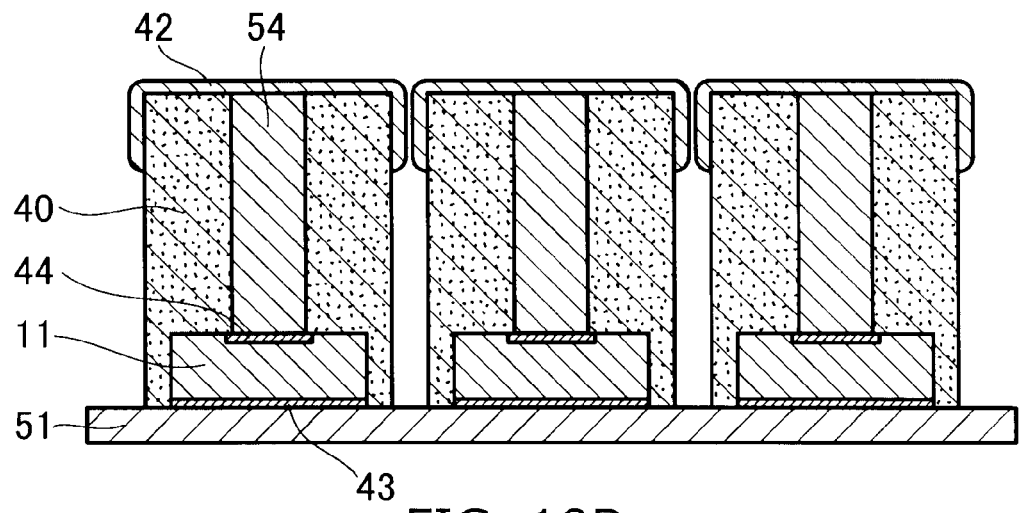

Next, as shown in FIG. 10B, by metal plating, a second external electrode 42 made of a cap-like electrode film is formed at the end of the sealing portion 40, and simultaneously, a conductive portion 54 is formed in the hole 53.

Figure 10C:
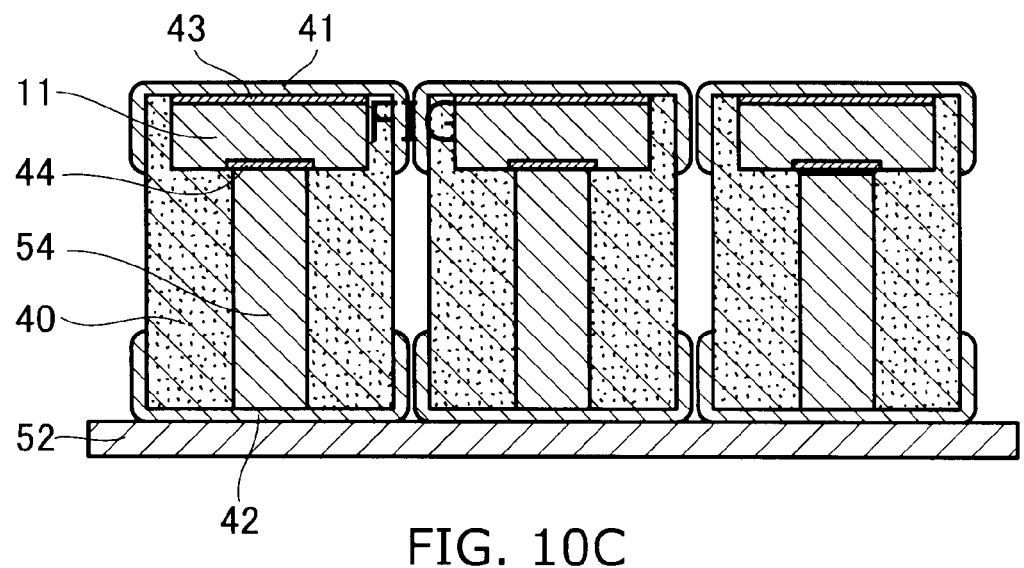

Next, as shown in FIG. 10C, the workpiece is inverted to bring the fixing sheet 51 on top so that the semiconductor device 11 is located on the upside, and it is stuck onto another fixing sheet 52 via the second electrode 42. Then the upper fixing sheet 51 is removed, and a first external electrode 41 made of a cap-like electrode film is formed on the semiconductor device 11 by metal plating. Thus, also in this method, a semiconductor apparatus as shown in FIGS. 5 and 6 is completed.

In the semiconductor apparatus manufactured by the manufacturing process shown in FIGS. 9 and 10, the second external electrode 42 and the conductive portion 54 can be formed in the same manufacturing step by metal plating, and hence the material cost can be reduced.

Figure 11:
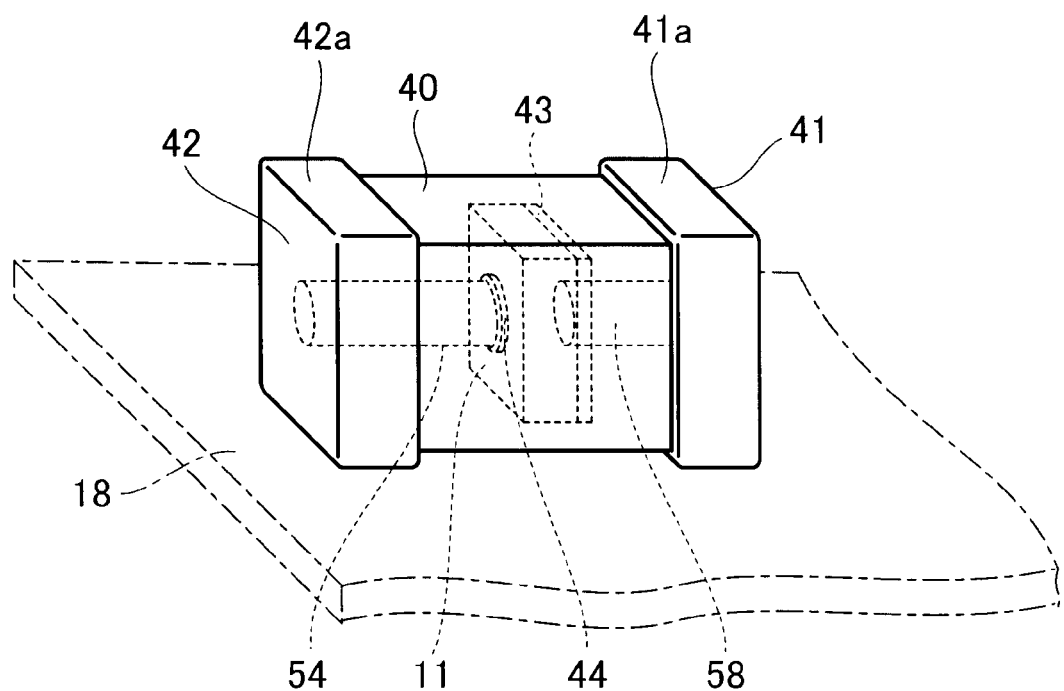
FIG. 11 is a perspective view of a semiconductor apparatus according to a fourth embodiment.

FIG. 11 is a perspective view of a semiconductor apparatus according to a fourth embodiment.

Figure 12:
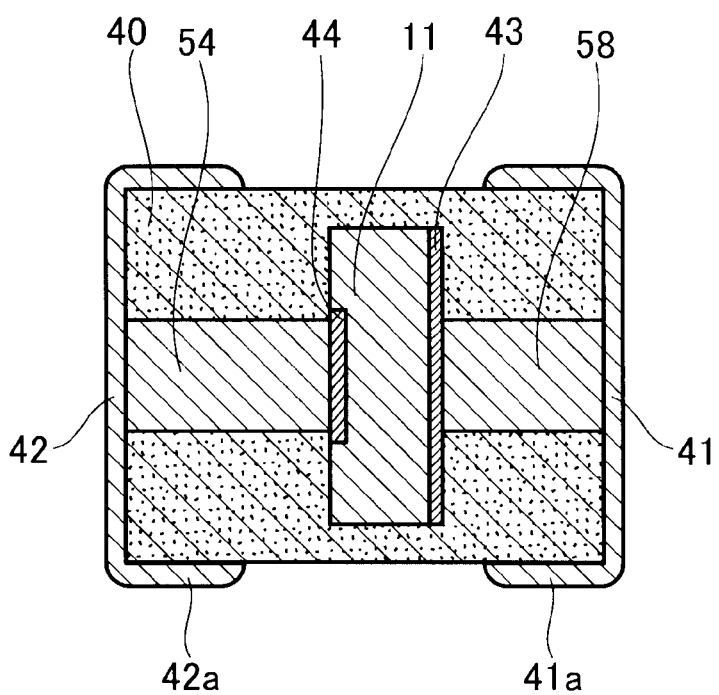
FIG. 12 is a longitudinal cross-sectional view of the semiconductor apparatus of this embodiment.

FIG. 12 is a longitudinal cross-sectional view of the semiconductor apparatus of this embodiment.

The semiconductor apparatus of the fourth embodiment comprises a semiconductor device 11 having electrodes 43, 44 on both sides, a second external electrode 42 made of a cap-like electrode film provided on one side (referred to as "backside" for convenience) of the semiconductor device 11, a first external electrode 41 made of a cap-like electrode film provided on the other side (referred to as "frontside" for convenience) of the semiconductor device 11, and a sealing portion 40 provided on both of the frontside and backside of the semiconductor device 11.

A conductive portion (projection) 54 connected to the second electrode 44 on the backside of the semiconductor device 11 and a conductive portion (projection) 58 connected to the first electrode 43 on the frontside of the semiconductor device 11 are provided at the center of the sealing portion 40. The second external electrode 42 has a major surface connected to the tip surface of the conductive portion 54 and a bent side surface 42a extending on the outer periphery of the sealing portion 40. The first external electrode 41 has a major surface connected to the tip surface of the conductive portion 58 and a bent side surface 41a extending on the outer periphery of the sealing portion 40. The semiconductor apparatus of this embodiment is mounted on the substrate 18 at the side surface 41a, 42a of the external electrodes 41, 42, that is, at the portion extending on the outer periphery of the sealing portion 40.

FIGS. 13 and 14 are process cross-sectional views showing a process for manufacturing the semiconductor apparatus 10 of the fourth embodiment.

Figure 13A:
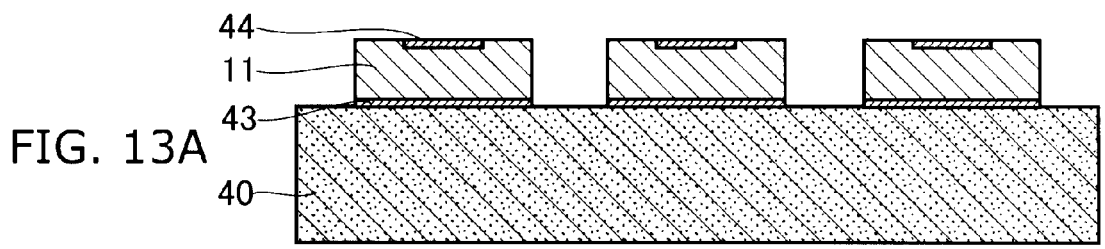
FIGS. 13A through 14C are process cross-sectional views showing a process for manufacturing the semiconductor apparatus 10 of the fourth embodiment.

As shown in FIG. 13A, the wafer 50 is cut by a dicing blade (not shown) or the like into individual semiconductor devices 11, which are then placed on a sealing portion 40. The sealing portion 40 is illustratively a resin plate formed by resin molding. The electrodes 43, 44 are illustratively made of gold, silver, or nickel.

Figure 13B:
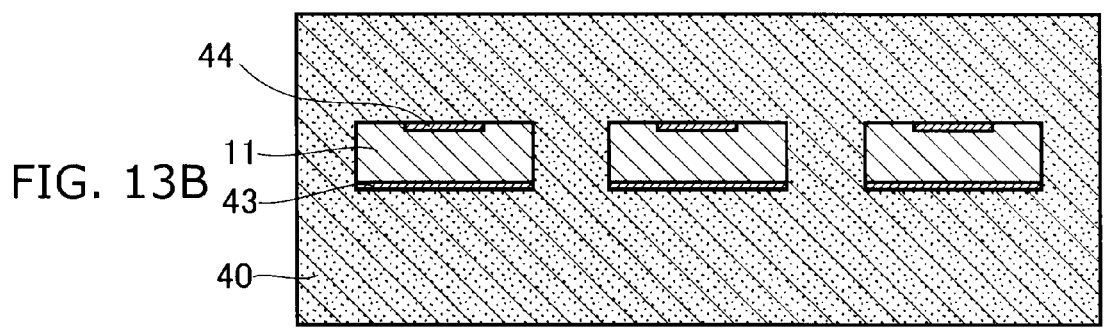

Next, as shown in FIG. 13B, the semiconductor devices 11 are entirely sealed with resin or other sealing material to form a sealing portion 40.

Figure 13C:
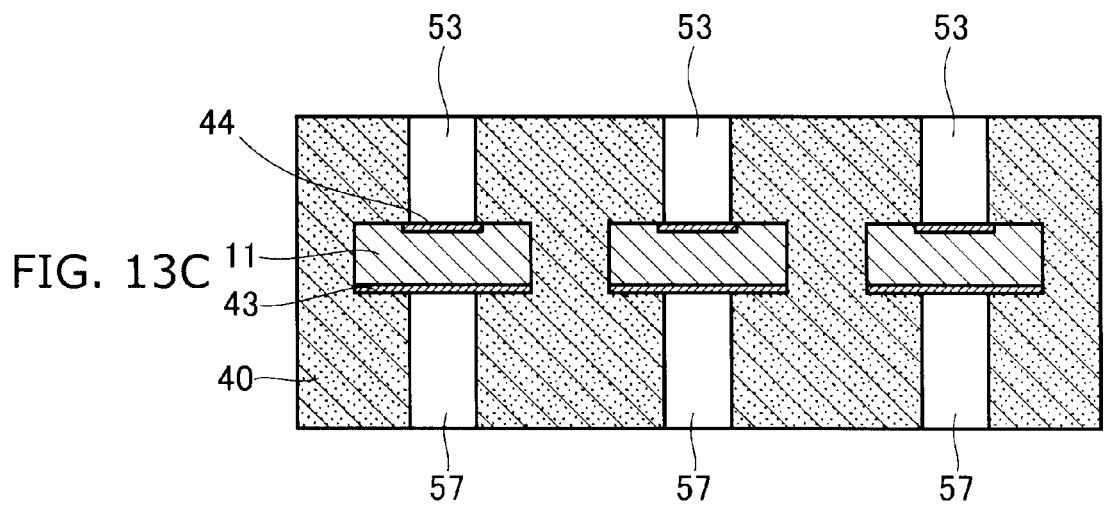

Next, as shown in FIG. 13C, the position of the sealing portion 40 corresponding to the first electrode 43 is bored by laser or the like to form a hole 57. Likewise, the position of the sealing portion 40 corresponding to the second electrode 44 is bored by laser or the like to form a hole 53.

Figure 13D:
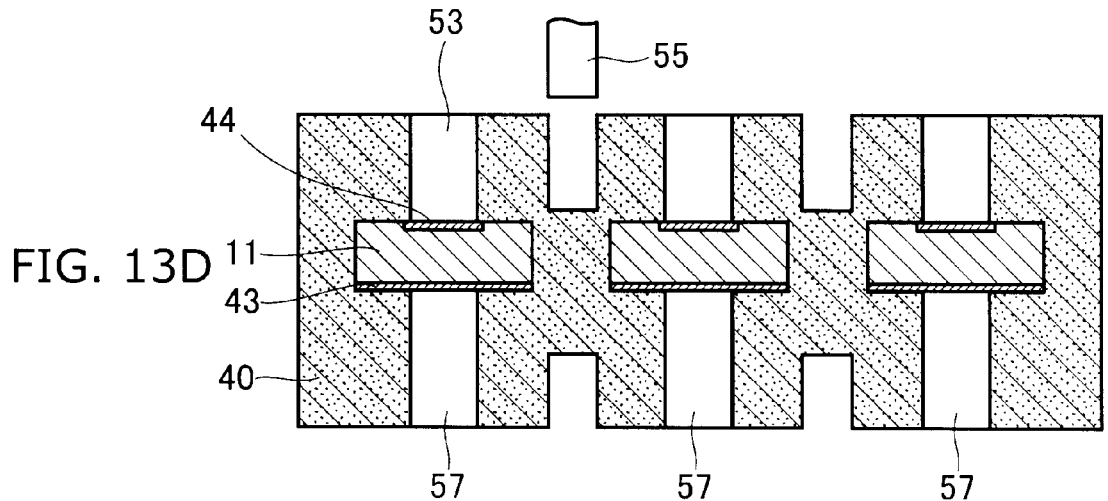
Figure 14A:
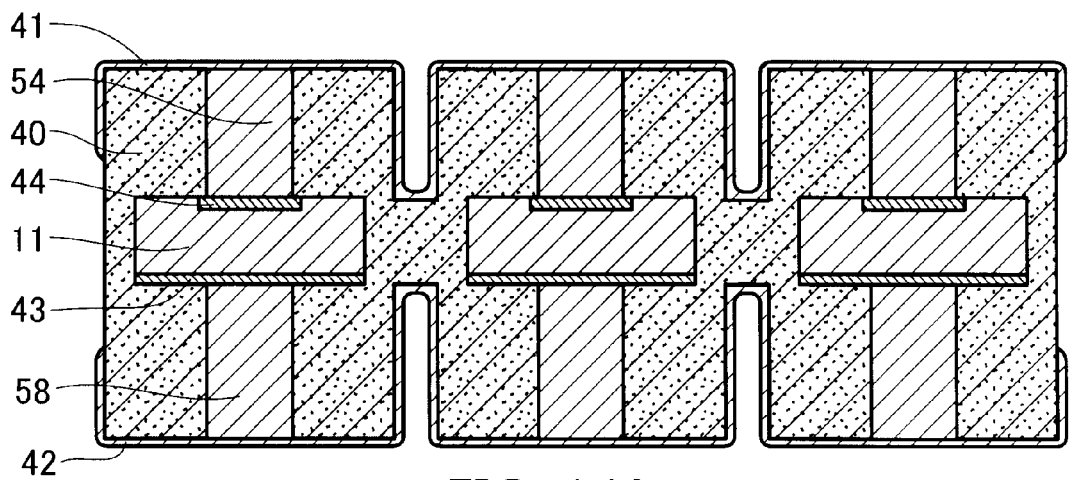

Next, as shown in FIG. 13D, the sealing portion 40 is cut partway by a dicing blade 55 or the like. Next, as shown in FIG. 14A, by metal plating, a conductive portion 54 is formed in the hole 53, and a first external electrode 41 made of a cap-like electrode film is formed at the end of the sealing portion 40 and on the inner wall of the groove cut partway.

Furthermore, by metal plating, a conductive portion 58 is formed in the hole 57, and a second external electrode 42 made of a cap-like electrode film is formed at the end of the sealing portion 40 and on the inner wall of the groove cut partway.

Figure 14B:
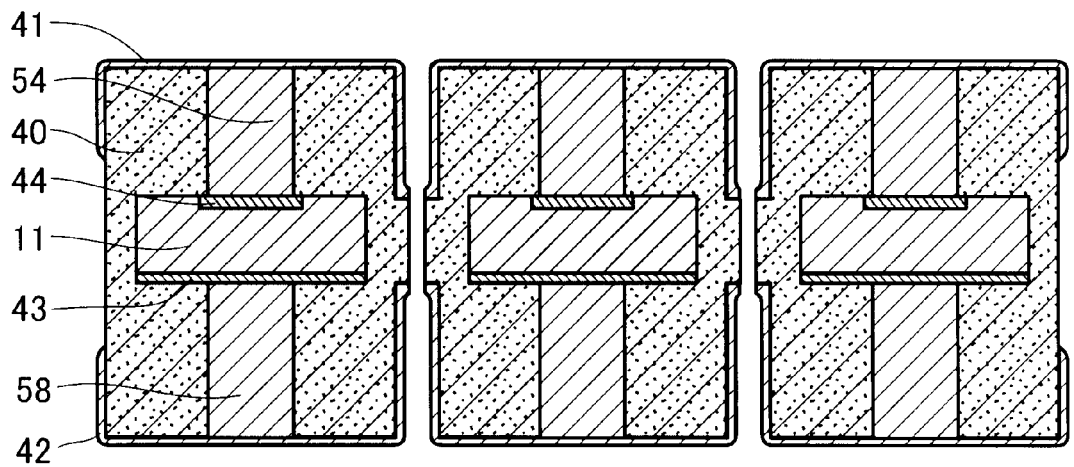

Next, as shown in FIG. 14B, the sealing portion 40, together with the metal plating formed at the bottom of the groove cut partway, is cut into individual semiconductor devices 11 by a dicing blade, not shown, having a narrower width than the dicing blade 55. It is noted that the means for cutting the sealing portion 40 is not limited to the dicing blade, but it can be cut by laser or the like. Here, in the semiconductor device 11 after the cutting, the center (diced portion) of the sealing portion 40 has a larger width than the external electrodes 41, 42. Hence, in this state, it is difficult to use the side surface 41a, 42a of the external electrodes 41, 42 as a mounting surface.

Figure 14C:
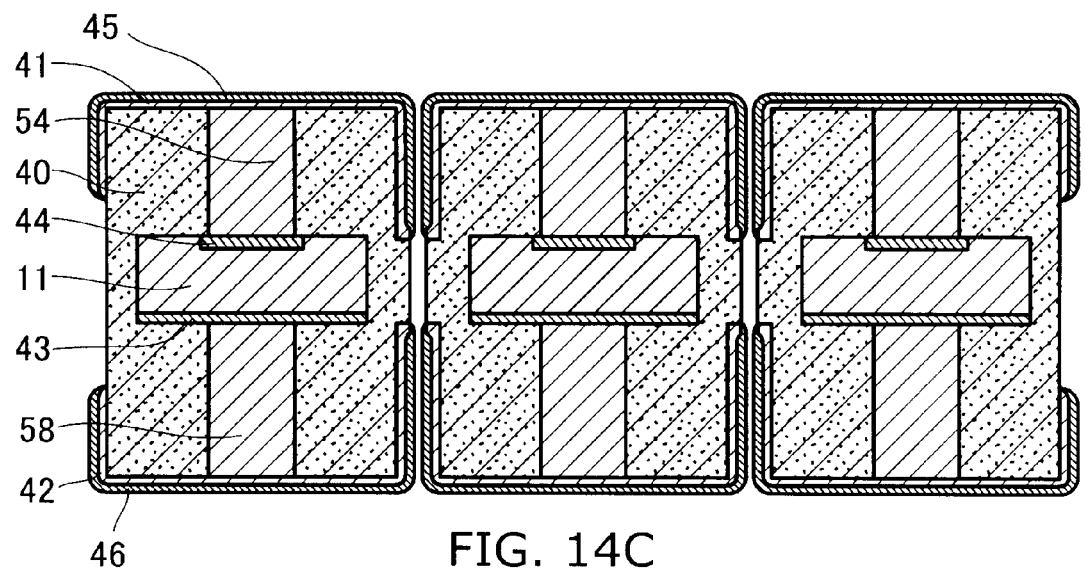

Next, as shown in FIG. 14C, a barrel plating 45, 46 is further applied onto the external electrodes 41, 42. The barrel plating 45, 46 is a plating illustratively made of nickel (Ni) and tin (Sn). Thus the external electrode 41, 42 including the barrel plating 45, 46 has a larger width than the center of the sealing portion 40, allowing the side surface 41a, 42a of the external electrodes 41, 42 to be used as a mounting surface.

As an alternative manufacturing process of this embodiment, in FIG. 13D, full dicing can be performed to form individual semiconductor devices 11. Then, by metal plating, external electrodes 41, 42 made of a cap-like electrode film can be formed at the ends of the sealing portion 40, and simultaneously, conductive portions 54, 58 can be formed in the holes 53, 57.

In the semiconductor apparatus 10 of this embodiment, the first external electrode 41, the second external electrode 42, and the conductive portions 54, 58 can be formed in the same manufacturing step by metal plating, and hence the material cost can be reduced.

FIGS. 15 and 16 are process cross-sectional views showing a process for manufacturing the semiconductor apparatus 10 of a fifth embodiment.

The semiconductor apparatus of the fifth embodiment comprises a semiconductor device 11 having electrodes 43, 44 on both sides, a sealing portion 40 protruding from one side (referred to as "backside" for convenience) of the semiconductor device 11, a first external electrode 41 made of a cap-like electrode film provided on the other side (referred to as "frontside" for convenience) of the semiconductor device 11, and a second external electrode 42 made of a cap-like electrode film provided on the tip surface of the sealing portion 40 opposite to the semiconductor device 11.

A conductive portion (projection) 54 connected to the second electrode 44 via a conductive material 60 such as a conductive paste on the backside of the semiconductor device 11 is provided at the center of the sealing portion 40. The second external electrode 42 has a major surface connected to the tip surface of the conductive portion 54 and a bent side surface 42a extending on the outer periphery of the sealing portion 40. The first external electrode 41 has a major surface connected to the first electrode 43 and a bent side surface 41a extending on the outer periphery of the sealing portion 40. The external electrodes 41, 42 are illustratively made of copper foil, and illustratively plated with gold for mounting on the substrate 18. The semiconductor apparatus of this embodiment is mounted on the substrate 18 at the side surface 41a, 42a of the external electrodes 41, 42, that is, at the portion extending on the outer periphery of the sealing portion 40.

Figure 15A:
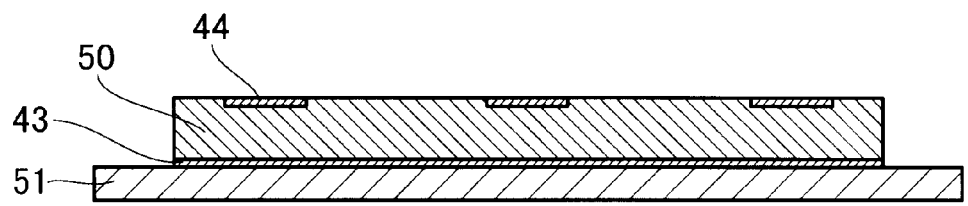
FIGS. 15A through 16C are process cross-sectional views showing a process for manufacturing the semiconductor apparatus 10 of a fifth embodiment.

As shown in FIG. 15A, a first electrode 43 is provided on the lower surface of a long plate-like wafer 50 throughout the length thereof. A second electrode 44 is provided on the upper surface of the wafer 50 at a position corresponding to each semiconductor device. The electrodes 43, 44 are illustratively made of gold, silver, or nickel. The wafer 50 is stuck onto a fixing sheet 51 via the first electrode 43. The fixing sheet 51 is illustratively a dicing sheet that sucks the wafer 50 and releases the suction by ultraviolet irradiation or heating.

Figure 15B:
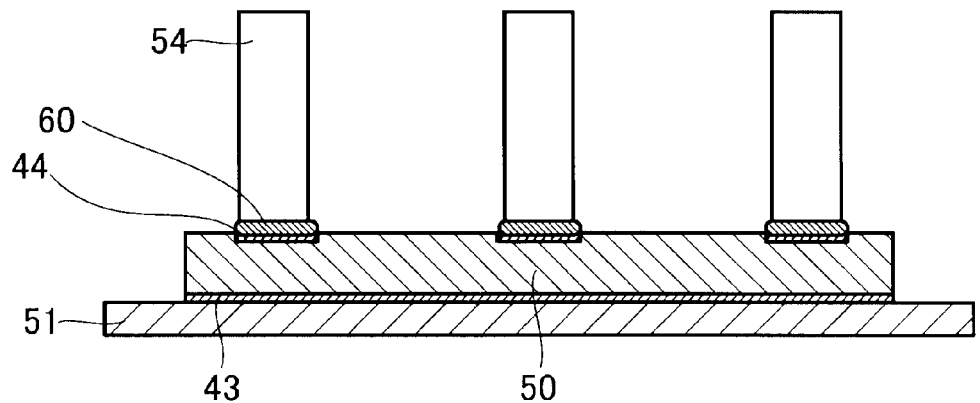

Next, as shown in FIG. 15B, a conductive portion 54 is bonded to the second electrode 44 via a conductive material 60.

Figure 15C:
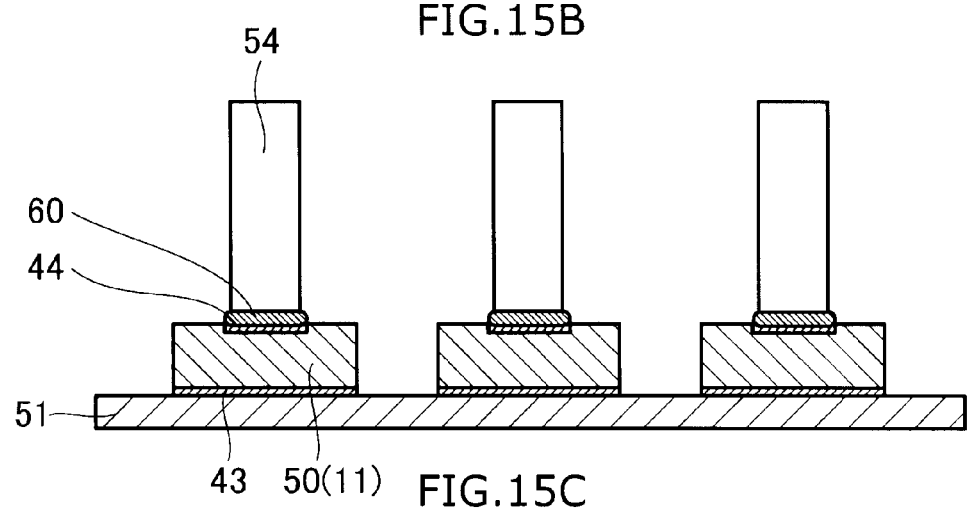

Next, as shown in FIG. 15C, the wafer 50 is cut by a dicing blade (not shown) or the like into individual semiconductor devices 11, each with the conductive portion 54 connected via the conductive material 60.

Here, the manufacturing process from FIGS. 15A to 15C is different from the manufacturing process as disclosed in the above-mentioned Patent Document 2, where a wafer 50 is cut by a dicing blade (not shown) or the like, and then a conductive portion 54 (e.g., a wire bonded to the electrode via a bump) is formed on the second electrode 44.

Figure 15D:
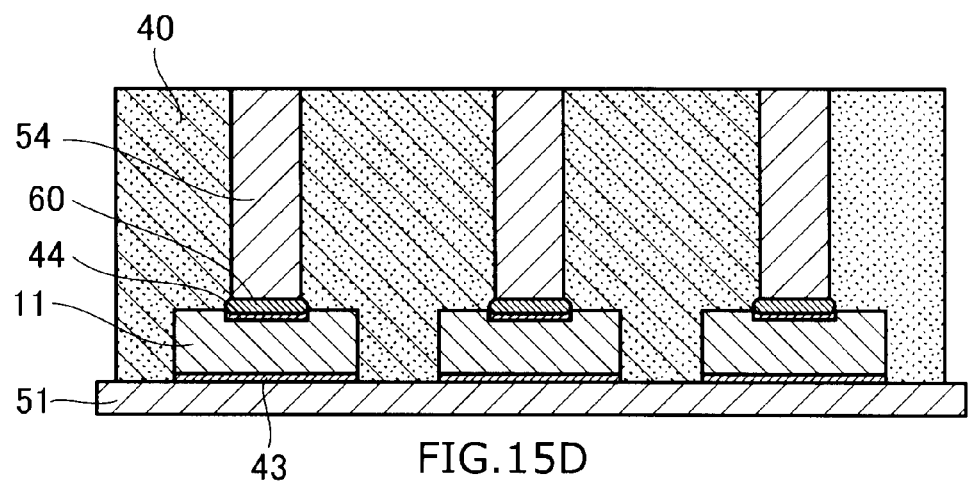

Next, as shown in FIG. 15D, the semiconductor devices 11 are entirely sealed with resin or other sealing material to form a sealing portion 40. The lower end surface of the conductive portion 54 is connected to the second electrode 44 via the conductive material 60, and the upper end surface is generally coplanar with the end surface of the sealing portion 40.

Figure 16A:
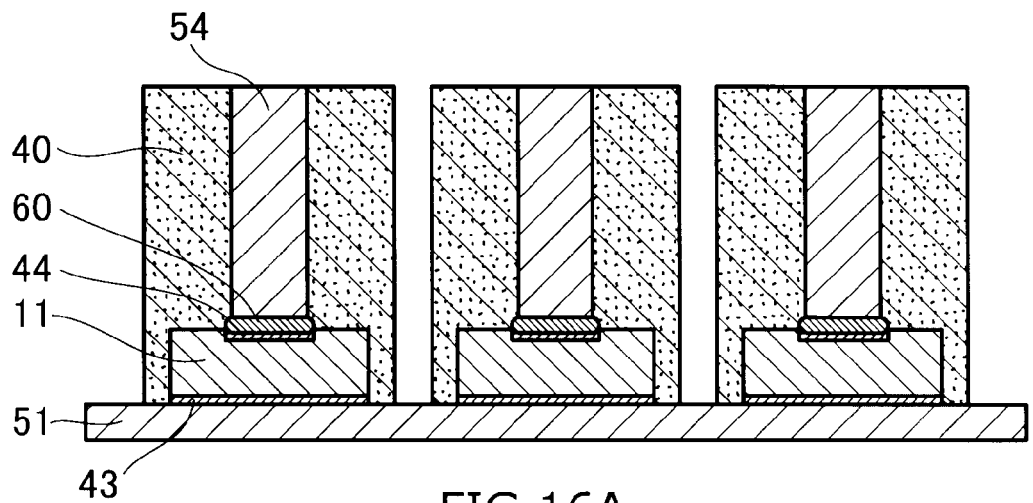

Next, as shown in FIG. 16A, the sealing portion 40 is cut by a dicing blade (not shown) or the like into individual semiconductor devices 11.

Figure 16B:
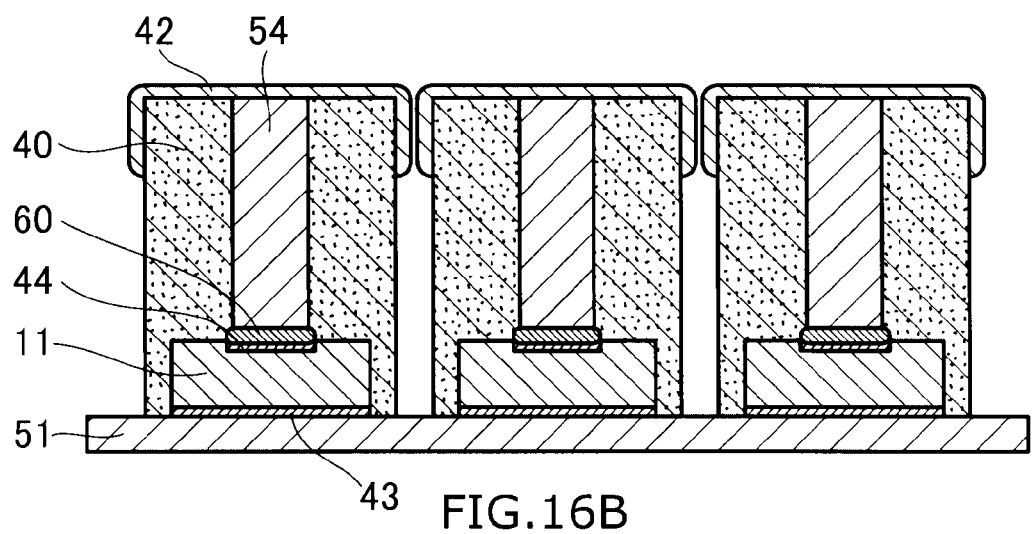

Next, as shown in FIG. 16B, by using copper foil or the like, a second external electrode 42 made of a cap-like electrode film is formed at the end of the sealing portion 40. The surface of the external electrode 42 can be plated with gold or the like.

Figure 16C:
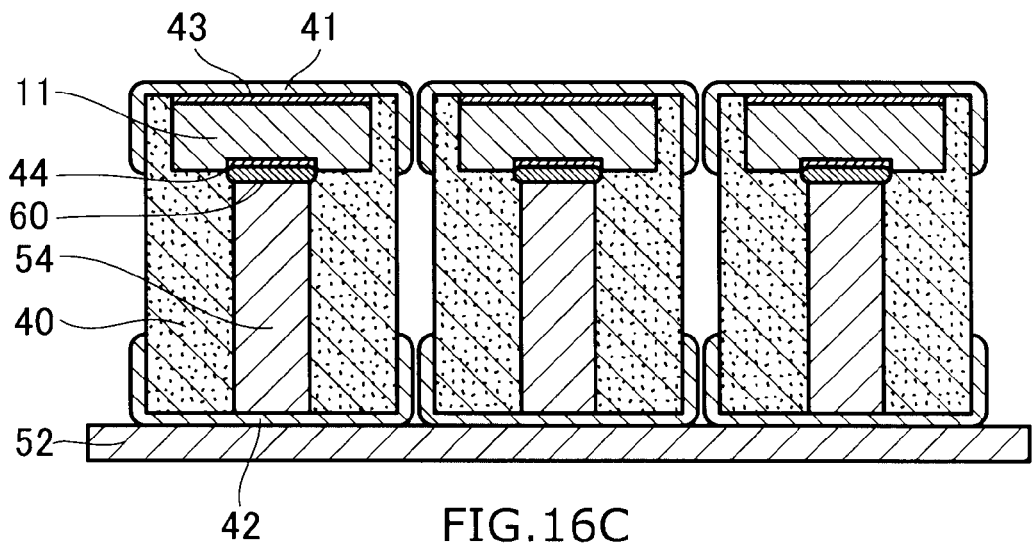
Figure 17A:
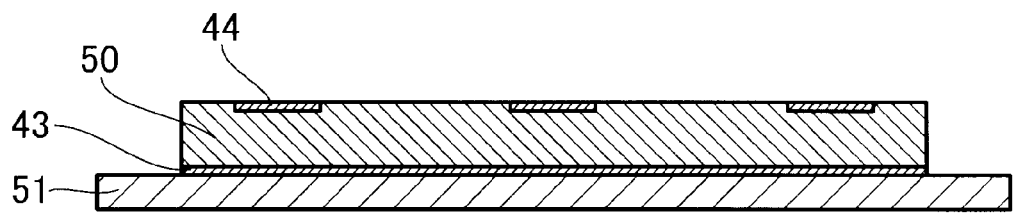
FIGS. 17A through 18D are process cross-sectional views showing a process for manufacturing the semiconductor apparatus 10 of a sixth embodiment.
Figure 17B:
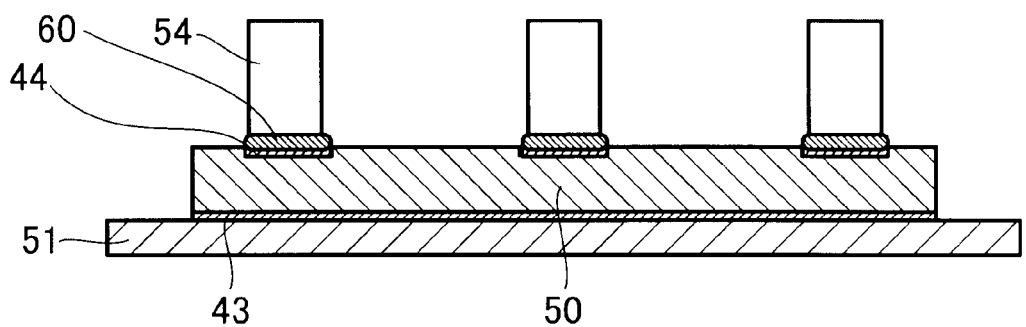
Figure 17C:
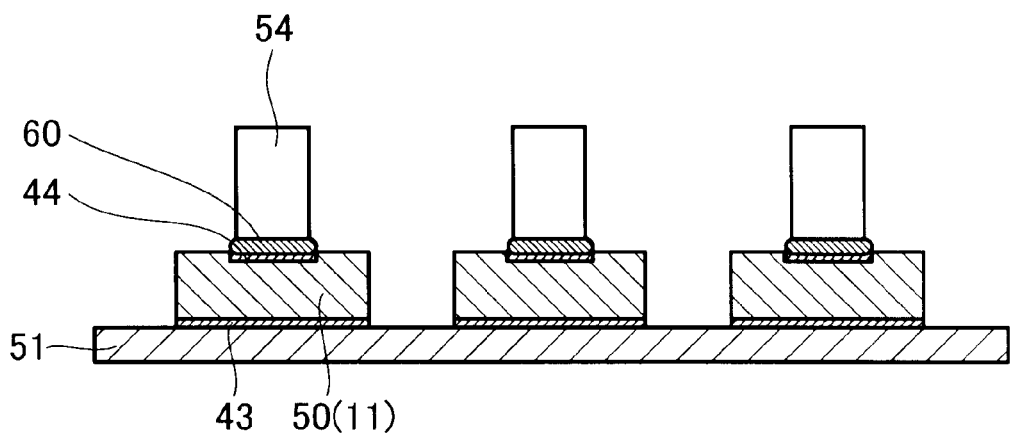
Figure 17D:
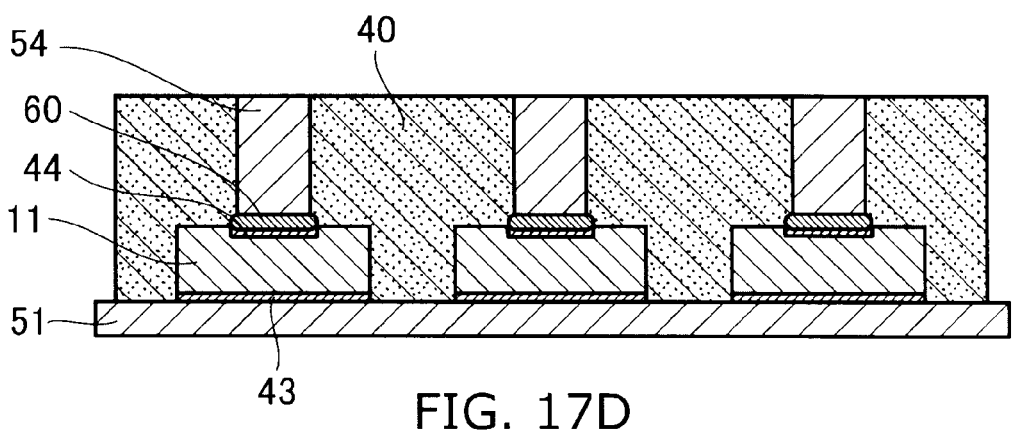

Next, as shown in FIG. 16C, the workpiece is inverted to bring the fixing sheet 51 on top so that the semiconductor device 11 is located on the upside, and it is stuck onto another fixing sheet 52 via the second electrode 42. Then the upper fixing sheet 51 is removed, and a first external electrode 41 made of a cap-like electrode film is formed on the semiconductor device 11. Thus a semiconductor apparatus as shown in FIGS. 15 and 16 is completed.

In the semiconductor apparatus as shown in FIGS. 15 and 16, the external electrode 41, 42 is made of a cap-like electrode film without using an electrode plate and an electrode block. Thus the semiconductor apparatus can be downsized, and the material cost and the manufacturing cost can be reduced.

FIGS. 17 and 18 are process cross-sectional views showing a process for manufacturing the semiconductor apparatus 10 of a sixth embodiment.

Figure 18A:
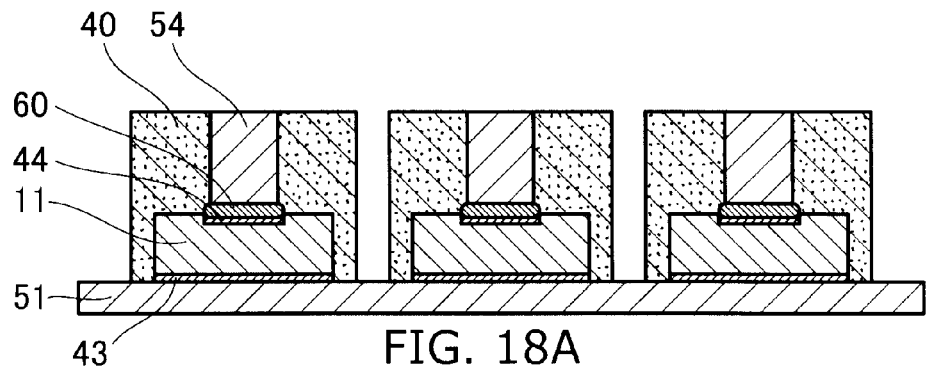
Figure 18B:
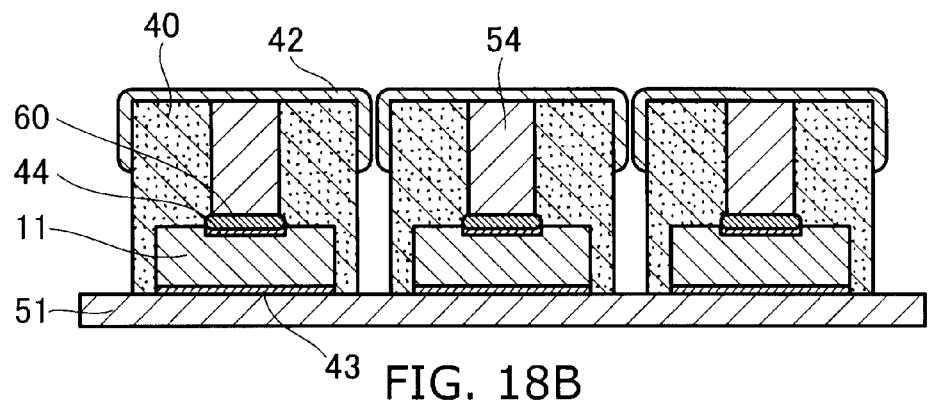
Figure 18C:
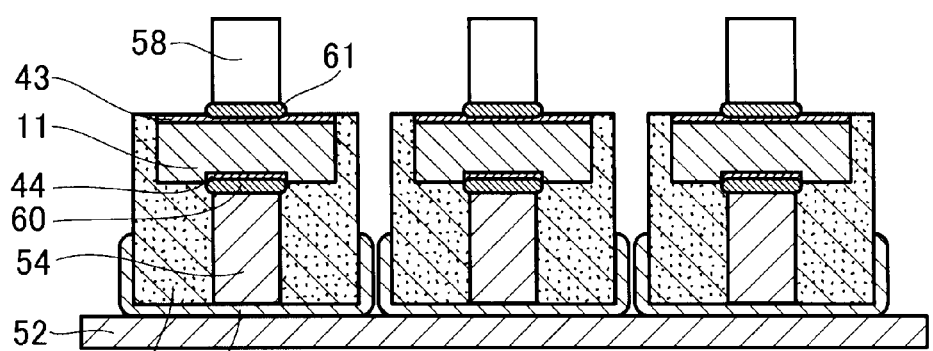
Figure 18D:
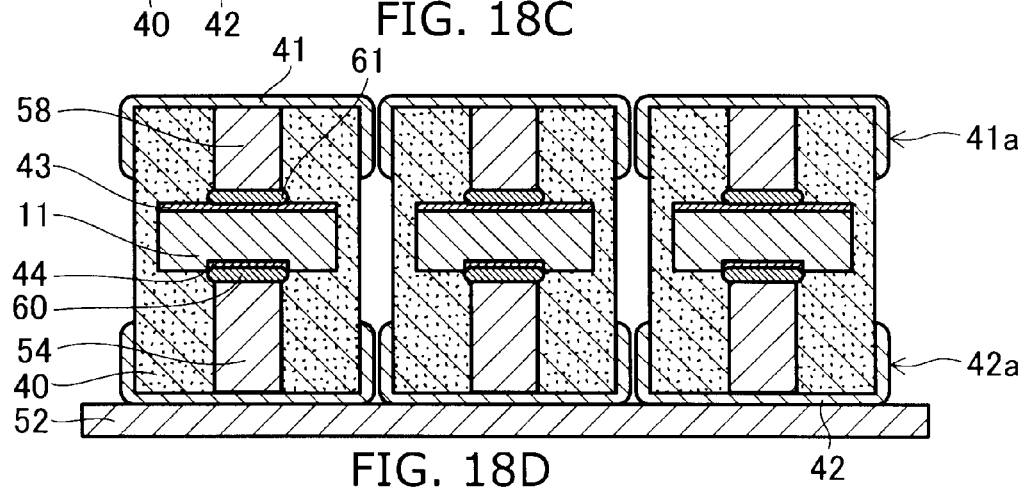

As shown in FIG. 18D, the semiconductor apparatus of the sixth embodiment comprises a semiconductor device 11 having electrodes 43, 44 on both sides, a sealing portion 40 protruding from both sides of the semiconductor device 11, a second external electrode 42 made of a cap-like electrode film provided on one side (referred to as "backside" for convenience) of the semiconductor device 11, and a first external electrode 41 made of a cap-like electrode film provided on the other side (referred to as "frontside" for convenience) of the semiconductor device 11.

As shown in FIG. 18D, the semiconductor device 11 is placed at the center of the sealing portion 40. A conductive portion (projection) 54 connected to the second electrode 44 via a conductive material 60 such as a conductive paste is provided on the backside of the semiconductor device 11, and a conductive portion (projection) 58 connected to the first electrode 43 via a conductive material 61 such as a conductive paste is provided on the frontside of the semiconductor device 11. The second external electrode 42 has a major surface connected to the tip surface of the conductive portion 54 and a bent side surface 42a extending on the outer periphery of the sealing portion 40. The first external electrode 41 has a major surface connected to the tip surface of the conductive portion 58 and a bent side surface 41a extending on the outer periphery of the sealing portion 40. The external electrodes 41, 42 are illustratively made of copper foil, and illustratively plated with gold for mounting on the substrate 18. The semiconductor apparatus of this embodiment is mounted on the substrate 18 at the side surface 41a, 42a of the external electrodes 41, 42, that is, at the portion extending on the outer periphery of the sealing portion 40.

The manufacturing steps in this embodiment shown in FIGS. 17A to 18F are almost the same as the manufacturing steps in the fifth embodiment of the invention shown in FIGS. 15A to 16F, and hence the detailed description thereof is omitted here.

Next, as shown in FIG. 18C, the workpiece is inverted to bring the fixing sheet 51 on top so that the semiconductor device 11 is located on the upside, and it is stuck onto another fixing sheet 52 via the second electrode 42. Then the upper fixing sheet 51 is removed, and a conductive portion 58 is bonded to the first electrode 43 via a conductive material 61.

Next, as shown in FIG. 18D, the sealing portion 40 is formed from resin or other sealing material so as to protrude from the frontside of each semiconductor device 11. The lower end surface of the conductive portion 58 is connected to the first electrode 43 via the conductive material 61, and the upper end surface is generally coplanar with the end surface of the sealing portion 40. Next, by using copper foil or the like, a first external electrode 41 made of a cap-like electrode film is formed at the end of the sealing portion 40 on the frontside of each semiconductor device 11. Thus a semiconductor apparatus as shown in FIGS. 17 and 18 is completed.

In the semiconductor apparatus as shown in FIGS. 17 and 18, the external electrode 41, 42 is made of a cap-like electrode film without using an electrode plate and an electrode block. Thus the semiconductor apparatus can be downsized, and the material cost and the manufacturing cost can be reduced.

As described above, in the method for manufacturing a semiconductor apparatus of the first and second embodiment, the semiconductor apparatus 10 can be formed simply by bonding the external electrodes 12, 13 on both sides of the semiconductor device 11 via the adhesive 14. Hence the manufacturing cost can also be reduced. Furthermore, by supplying a viscous sealing material to the periphery of the semiconductor device, sealing is achieved by surface tension. Hence the sealing work can be conducted cost-effectively without using a mold.

On the other hand, the semiconductor apparatus of the third and fifth embodiment has a structure in which the external electrode 42 is connected by the conductive portion 54 provided in the sealing portion 40. Hence no bonding wire is needed, and the external electrode 41, 42 can be configured as a thin film. Hence, further downsizing can be achieved, and the material cost and the manufacturing cost can be reduced.

In the method for manufacturing a semiconductor apparatus of the third embodiment, the sealing portion 40 is collectively formed on the multiply divided semiconductor devices 11, a conductive paste is injected into the sealing portion 40 to form a conductive portion 54 connected to the electrode 44 of each semiconductor device 11, and an external electrode 42 is formed at the tip of the sealing portion 40 and connected to the conductive portion 54. Thus the process for forming the sealing portion 40, the conductive portion 54, and the external electrodes 41, 42 can be performed collectively. Hence the manufacturing process can be simplified to achieve cost reduction.

In the alternative method for manufacturing a semiconductor apparatus of the third embodiment, by metal plating, a second external electrode 42 made of a cap-like electrode film is formed at the end of the sealing portion 40, and simultaneously, a conductive portion 54 is formed in the hole 53. Thus the external electrode 42 can be configured as a thin film. Hence, further downsizing can be achieved, and the material cost and the manufacturing cost can be reduced.

In the method for manufacturing a semiconductor apparatus of the fifth embodiment, a conductive portion 54 is connected to the electrode 44 via a conductive material 60, the sealing portion 40 is collectively formed on the multiply divided semiconductor devices 11, and an external electrode 42 is formed at the tip of the sealing portion 40 and connected to the conductive portion 54. Thus the process for forming the sealing portion 40, the conductive portion 54, and the external electrodes 41, 42 can be performed collectively. Hence the manufacturing process can be simplified to achieve cost reduction.

The semiconductor apparatus of the fourth and sixth embodiment has a structure in which the external electrode 42 is connected by the conductive portion 54 provided in the sealing portion 40, and the external electrode 41 is connected by the conductive portion 58 provided in the sealing portion 40. Hence no bonding wire is needed, and the external electrode 41, 42 can be configured as a thin film. Hence, further downsizing can be achieved, and the material cost and the manufacturing cost can be reduced.

In the method for manufacturing a semiconductor apparatus of the fourth embodiment, by metal plating, a first external electrode 41 made of a cap-like electrode film is formed at the end of the sealing portion 40, and simultaneously, a conductive portion 58 is formed in the hole 57. Furthermore, by metal plating, a second external electrode 42 made of a cap-like electrode film is formed at the end of the sealing portion 40, and simultaneously, a conductive portion 54 is formed in the hole 53. Thus the external electrode 41, 42 can be configured as a thin film. Hence, further downsizing can be achieved, and the material cost and the manufacturing cost can be reduced.

In the method for manufacturing a semiconductor apparatus of the sixth embodiment, a conductive portion 54 is connected to the electrode 44 via a conductive material 60, a conductive portion 58 is connected to the electrode 43 via a conductive material 61, the sealing portion 40 is collectively formed on the multiply divided semiconductor devices 11, and an external electrode 41, 42 is formed at the tip of the sealing portion 40 and connected to the conductive portion 54, 58. Thus the process for forming the sealing portion 40, the conductive portions 54, 58, and the external electrodes 41, 42 can be performed collectively. Hence the manufacturing process can be simplified to achieve cost reduction.

Figure 19B:
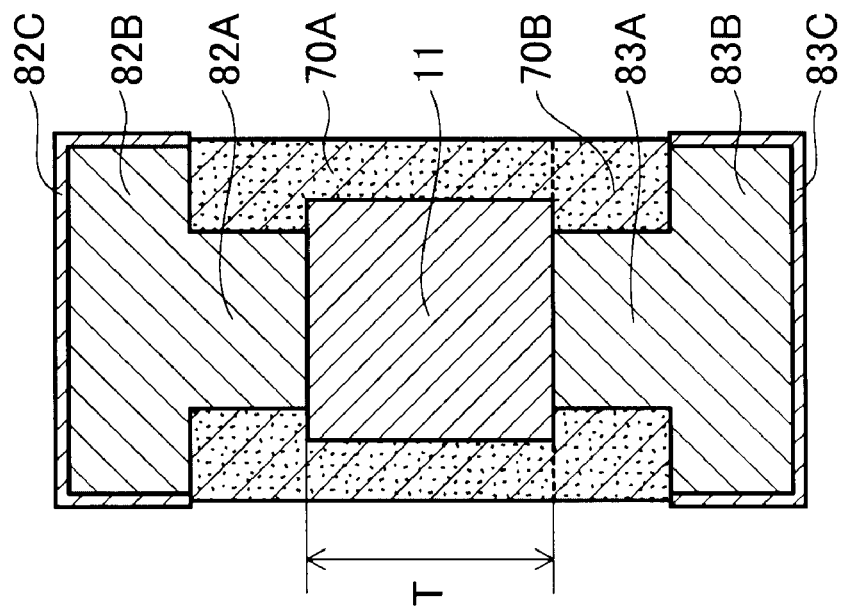
FIG. 19B is an A-A line cross sectional view of the semiconductor apparatus shown in FIG. 19A.
Figure 19A:
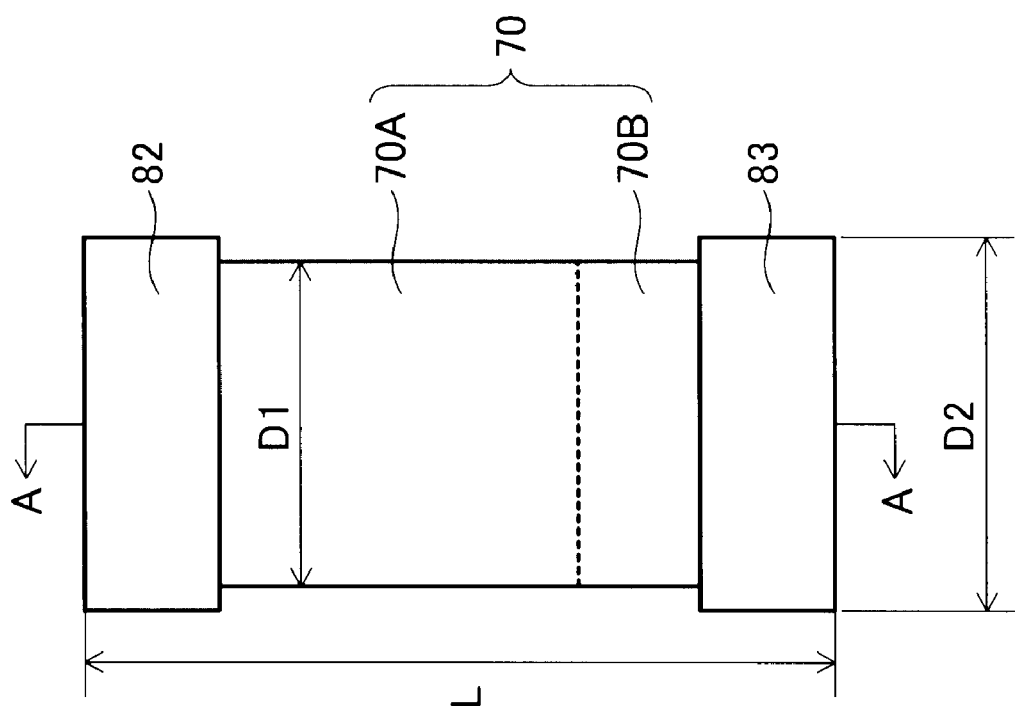
FIG. 19A is a planar view showing a semiconductor apparatus of a seventh embodiment.

FIG. 19A is a planar view showing a semiconductor apparatus of a seventh embodiment.

FIG. 19B is an A-A line cross sectional view of the semiconductor apparatus shown in FIG. 19A.

The semiconductor apparatus of the seventh embodiment comprises a semiconductor device 11, a first external electrode 82 and a second external electrode 83 provided on both side thereof, and a sealing portion 70. The semiconductor device 11 is a diode, for example. The semiconductor device 11 has a shape of a rectangular parallelepiped whose thickness T is 100-200 micrometers, and width is 200 micrometers, for example.

The first external electrode 82 has a connecting portion 82A having a smaller size and connected to the semiconductor device 11, and a lead portion 82B having a larger size and extending to the outside. Similarly, the second external electrode 83 has a connecting portion 83A having a smaller size and connected to the semiconductor device 11, and a lead portion 83B having a larger size and extending to the outside. The semiconductor device 11 and the projections 82A, 83A are covered by the sealing portion 70. The external electrodes 82, 83 are made of copper, for example. Plated layers 82C and 83C are formed on the surface of the lead portions 82B and 83B, respectively. Each of the plated layers 82C and 83C may include nickel layer and tin layer, for example.

The sealing portion 70 is made of a resin, for example, and includes a first sealing portion 70A and a second sealing portion 70B. The first and second sealing portions 70A and 70B may be made of a same kind of material, or may be made of different materials, while they are closely joined without gap.

The semiconductor apparatus of the present embodiment may be mounted on a substrate 18 as shown in FIGS. 5 and 11.

The length L of the semiconductor apparatus may be as small as 600 micrometers, for example. The width D1 of the sealing portion 70 may be slightly smaller than 300 micrometers and the width D2 of the external electrodes 82 and 83 (plated layers 82C and 83C) may be slightly larger than 300 micrometers, for example. By making the width D2 larger than the width D1, it becomes easy to obtain contacts between the lead portions 82B and 83B, and mounting electrodes provided on the substrate 18 when the semiconductor apparatus is mounted on the substrate 18 as shown in FIGS. 5 and 11.

Alternatively, as shown in FIG. 19C, the width D1 of the sealing portion 70 may be larger than the width D2 of the external electrodes 82 and 83 (plated layers 82C and 83C). In this case, it becomes easy to pickup the semiconductor apparatus at the sealing portion 70 by using a pickup tool of a vacuum chuck type when the semiconductor apparatus is mounted on a substrate.

As shown in FIG. 19D, it is possible to mount the semiconductor apparatus on the electrode pads 102 of the substrate 18 even if the external electrodes 82 and 83 (plated layers 82C and 83C) are recessed. As shown in FIG. 19D, the semiconductor apparatus is reliably mounted as the solder 104 intervenes between the external electrodes 82 and 83 (plated layers 82C and 83C), and the electrode pads 102. the thickness of the solder layer 104 intervening between the plated layers 82C and 83C, and the electrode pads 102 may be, for example, about 120 micrometers.

The semiconductor apparatus of the present embodiment is very compact so that a high density mounting may be realized. Further, as will be explained in detail later, a large number of semiconductor apparatuses can be fabricated from a single semiconductor wafer, and therefore the production cost can be greatly reduced.

FIGS. 20A through 22D are process cross-sectional views showing a process for manufacturing the semiconductor apparatus of the seventh embodiment.

Figure 20A:
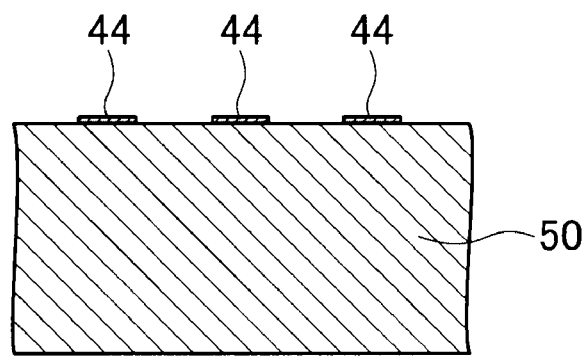
FIGS. 20A through 22D are process cross-sectional views showing a process for manufacturing the semiconductor apparatus of the seventh embodiment.

First, as shown in FIG. 20A, a semiconductor wafer 50 having electrodes 44 is prepared. A thickness of the semiconductor wafer 50 may be about 600 micrometers, for example.

Figure 20B:
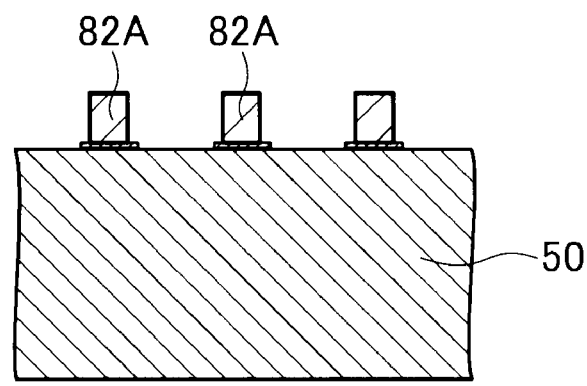

Next, as shown in FIG. 20B, projections 82A are formed on the electrodes 44. More specifically, a titanium layer and a copper layer is formed as seed layer for metal plating on the electrodes 44 by a sputtering. Then, a dry resist layer is coated on the semiconductor wafer 50, and openings are formed in the dry resist layer on the electrodes 44 by using a photolithography technique using a photomask having a predetermined optical pattern. Then, projections 82A are formed by plating metal layer such as copper on the electrodes 44. Then, the dry resist layer is removed. The thickness of the projection 82A may be about 100 micrometers, for example.

Figure 20C:
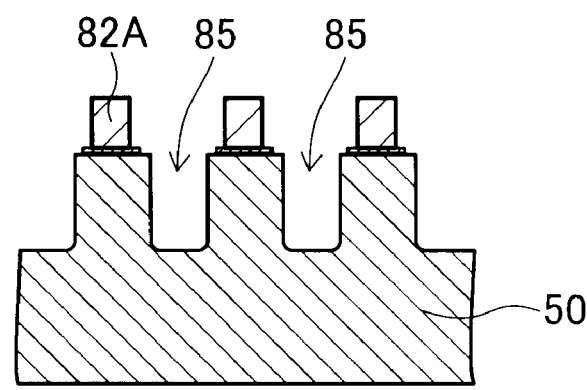

Next, as shown in FIG. 20C, grooves 85 are formed on the surface of the semiconductor wafer 50. More specifically, grooves 85 having a width of about 150 micrometers can be formed lengthwise and crosswise on the surface of the semiconductor wafer 50.

Figure 21A:
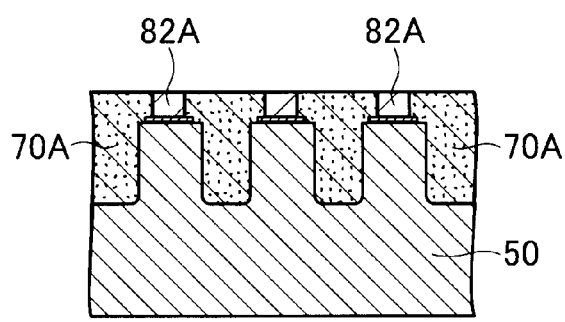

Next, as shown in FIG. 21A, first sealing portions 70A are formed by filling the grooves 85 and the gaps between the projections 82A by a resin. More specifically, fluidic resin material is applied onto the surface of the semiconductor wafer 50 and after curing the resin, the surface layer is polished so that the surface of the projection 82A is exposed.

Figure 21B:
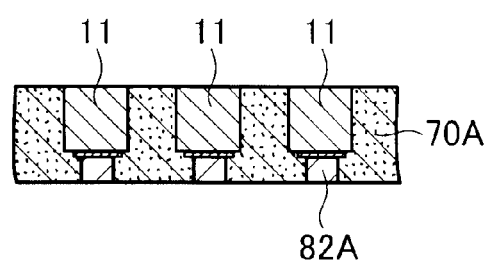

Next, as shown in FIG. 21B, the semiconductor wafer 50 is thinned by polishing the backside thereof. By thinning the semiconductor wafer 50, the semiconductor devices 11 formed thereon are separated each other.

Figure 21C:
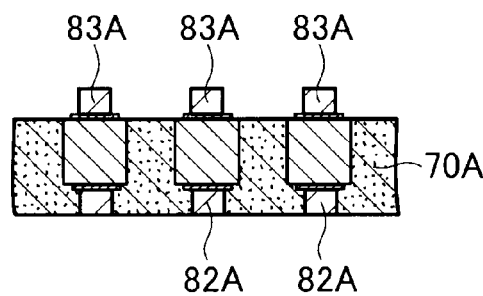

Next, as shown in FIG. 21C, projections 83A are formed on the backside surface of the semiconductor devices 11. The process to form the projections 83A may be similar to the process to form the projections 82A as described with reference to FIG. 20B.

Figure 21D:
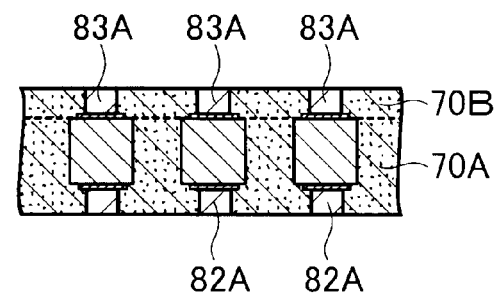

Next, as shown in FIG. 21D, sealing portions 70B are formed by filling resin into the gaps between the projections 83A. The fabrication process thereof may be the same as the process to form the sealing portion 70A as described with reference to FIG. 21A.

Figure 22A:
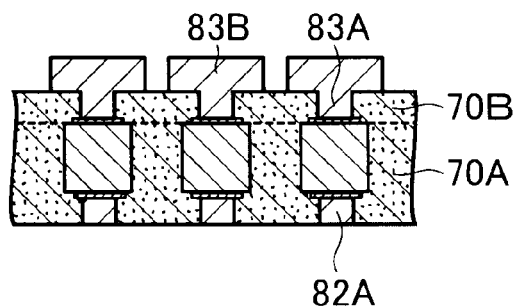

Next, as shown in FIG. 22A, lead portions 83B are formed. The lead portions 83B may be formed by plating copper using a metal plating technique, and the specific procedure thereof may be the same as that to form the projections 82A and 83A. A thickness of the lead portions 83B may be about 100 micrometers, for example.

Figure 22B:
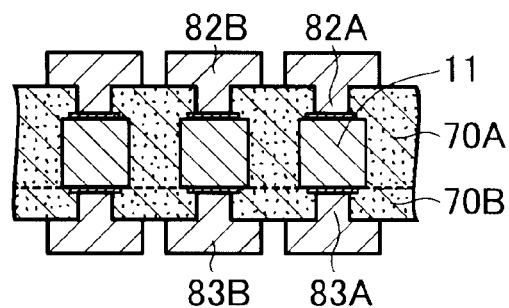

Next, as shown in FIG. 22B, lead portions 82B are formed. The lead portions 82B may also be formed by plating copper using a metal plating technique, and the specific procedure thereof may be the same as that to form the projections 82A and 83A. A thickness of the lead portions 82B may be about 100 micrometers, for example.

Figure 22C:
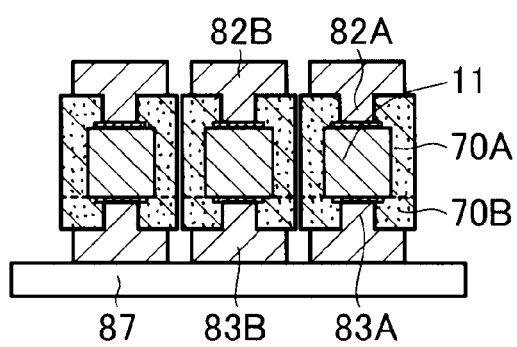

Next, as shown in FIG. 22C, the semiconductor devices are separated by attaching the work onto the dicing sheet 87 and by cutting into the individual semiconductor devices by using a blade dicer. A width of the dicing groove may be as small as 50 micrometers, for example.

Figure 22D:
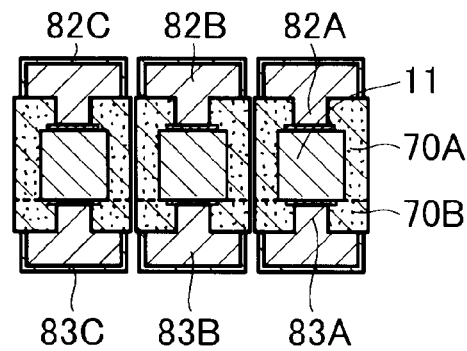

Next, as shown in FIG. 22D, the semiconductor apparatuses are removed from the dicing sheet 87, and plated layers 82C and 83C are formed by forming a nickel layer and a tin layer in this order on the surface of the lead portions 82B and 83B by using a metal plating technique. A thickness of the plated layers 82C and 83C may be about 5 to 10 micrometers.

As described with reference to FIGS. 19A through 19D, the width (D1 in FIGS. 19A and 19C) of the sealing portion 70 may be larger than the width (D2 in FIGS. 19A and 19C) of the plated layers 82C and 83C, alternatively, the width of the sealing portion 70 may be smaller than the width of the plated layers 82C and 83C.

As explained above, according to the embodiment, a great number of compact semiconductor apparatuses are fabricated by performing the fabrication process to the semiconductor wafer 50.

FIGS. 23A through 25C are process cross-sectional views showing a process for manufacturing the semiconductor apparatus of a second example of the seventh embodiment.

Figure 23A:
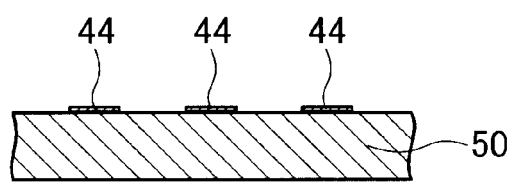
FIGS. 23A through 25C are process cross-sectional views showing a process for manufacturing the semiconductor apparatus of a second example of the seventh embodiment.

First, as shown in FIG. 23A, a semiconductor wafer 50 having electrodes 44 is prepared. A thickness of the semiconductor wafer 50 may be as thin as 200 micrometers, for example.

Figure 23B:
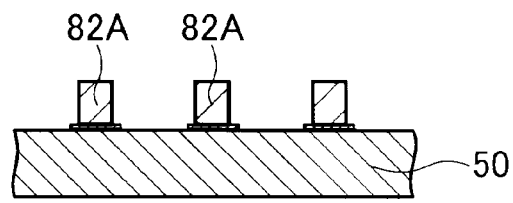

Next, as shown in FIG. 23B, projections 82A are formed on the electrodes 44. The process to form the projections 82A may be similar to the process to form he projections 82A as described with reference to FIG. 20B.

Figure 23C:
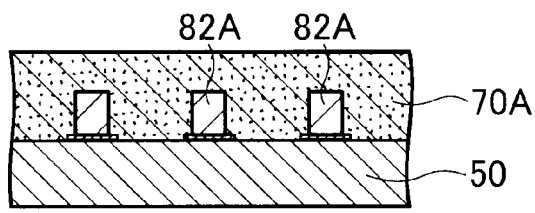
Figure 23D:
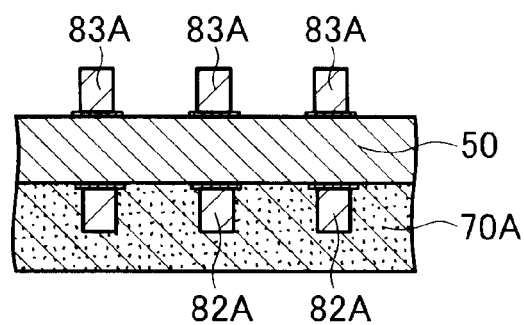

Next, as shown in FIG. 23C first sealing portions 70A are formed by applying resin onto the surface of the semiconductor wafer 50. In this process, the resin layer is formed thick enough so that the projection 82A is entirely covered.

Figure 24A:
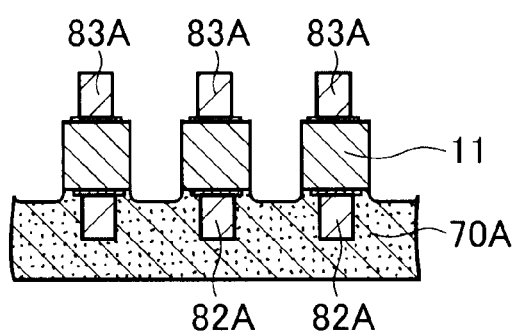
Figure 24B:
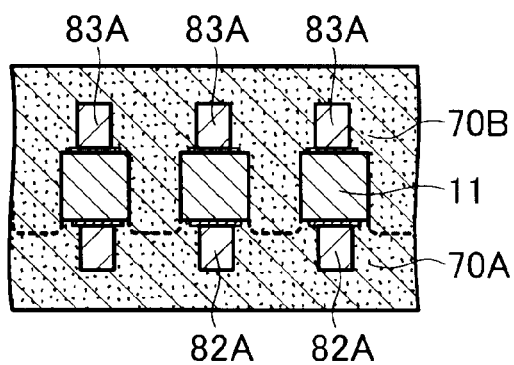
Figure 24C:
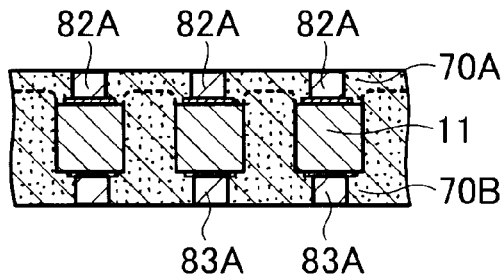
Figure 24D:
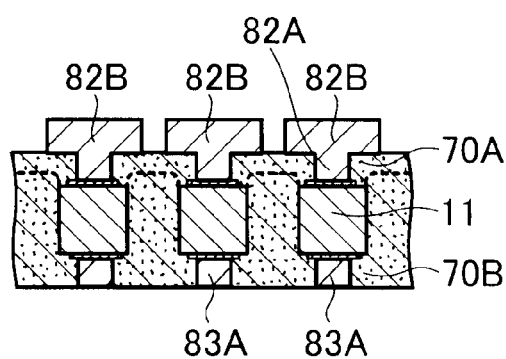

Next, as shown in FIG. 24D, projections 83A are formed on the backside surface of the semiconductor devices 11. The process to form the projections 83A may also be similar to the process to form the projections 82A as described with reference to FIG. 20B.

Next, as shown in FIG. 24A, the semiconductor devices 11 are separated by cutting the semiconductor wafer 50 using a blade dicer. The dicing grooves may be made lengthwise and crosswise on the surface of the semiconductor wafer 50.

Next, as shown in FIG. 24B, second sealing portions 70B are formed by filling resin into the gaps between the semiconductor devices 11 and the projections 83A. The sealing portions 70B is formed so that the projections 83A are entirely covered by the resin.

Next, as shown in FIG. 24C, the surfaces of the first sealing portion 70A and the second sealing portion 70B are polished so that the projections 82A and 83A are exposed.

Next, as shown in FIG. 24D, lead portions 82B are formed. The lead portions 82B may also be formed by plating copper using a metal plating technique, and the specific procedure thereof may be the same as that to form the projections 82A and 83A.

Figure 25A:
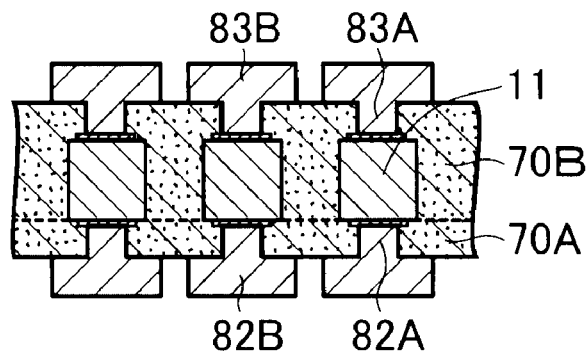

Next, as shown in FIG. 25A, lead portions 83B are formed. The lead portions 83B may also be formed by plating copper using a metal plating technique, and the specific procedure thereof may be the same as that to form the projections 82A and 83A.

Figure 25B:
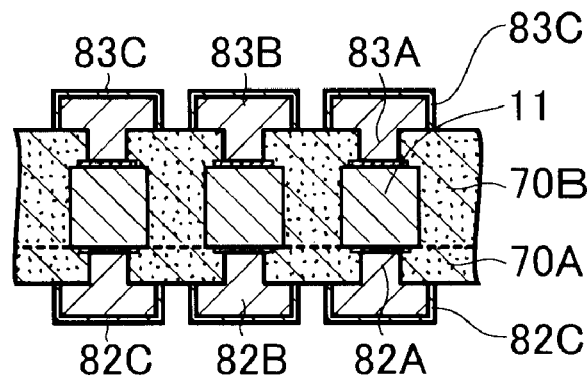

Next, as shown in FIG. 25B, plated layers 82C and 83C are formed by forming a nickel layer and a tin layer in this order on the surface of the lead portions 82B and 83B by using a metal plating technique. The thickness of the plated layers 82C and 83C may be about 5 to 10 micrometers.

Figure 25C:
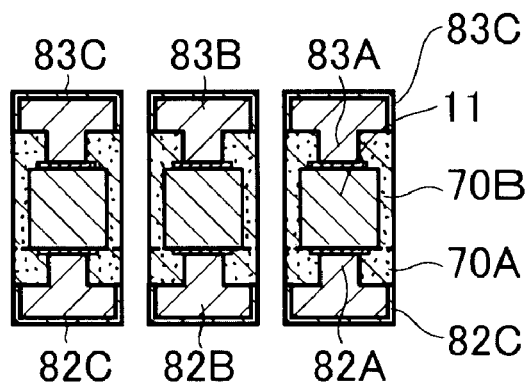

Next, as shown in FIG. 25C, the semiconductor apparatuses are separated by cutting with a blade dicer.

As described with reference to FIGS. 19A through 19D, the width (D1 in FIGS. 19A and 19C) of the sealing portion 70 may be larger than the width (D2 in FIGS. 19A and 19C) of the plated layers 82C and 83C, alternatively, the width of the sealing portion 70 may be smaller than the width of the plated layers 82C and 83C.

As explained above, according to the second example of the embodiment, a great number of compact semiconductor apparatuses are fabricated by performing the fabrication process to the semiconductor wafer 50.

FIGS. 26A through 28C are process cross-sectional views showing a process for manufacturing the semiconductor apparatus of an eighth embodiment.

Figure 26A:
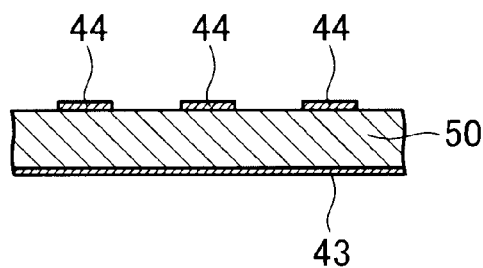
FIGS. 26A through 28C are process cross-sectional views showing a process for manufacturing the semiconductor apparatus of an eighth embodiment.

First, as shown in FIG. 26A, a semiconductor wafer 50 having electrodes 43 and 44 is prepared. A thickness of the semiconductor wafer 50 may be as thin as 200 micrometers, for example.

Figure 26B:
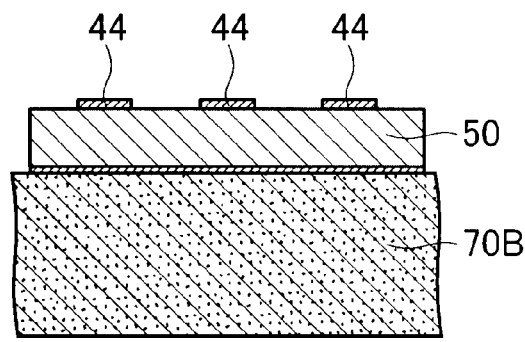

Next, as shown in FIG. 26B, a sealing portion 70B made of a resin is formed on a backside of the semiconductor wafer 50. The sealing portion 70B may be formed by using a molding technique such as a molding with a liquid resin, transfer molding, and a compression molding technique.

Figure 26C:
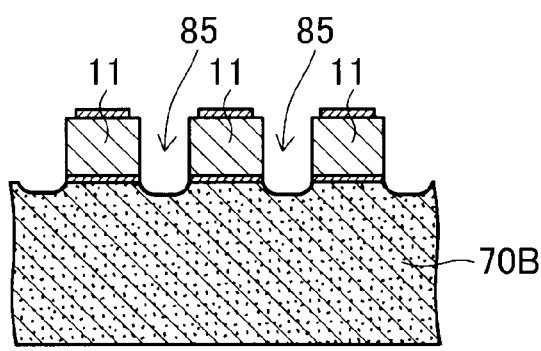

Next, as shown in FIG. 26C, the semiconductor wafer 50 is cut and semiconductor devices 11 are separated. The dicing grooves 85 are formed lengthwise and crosswise on the semiconductor wafer 50 by using a blade dicer.

Figure 26D:
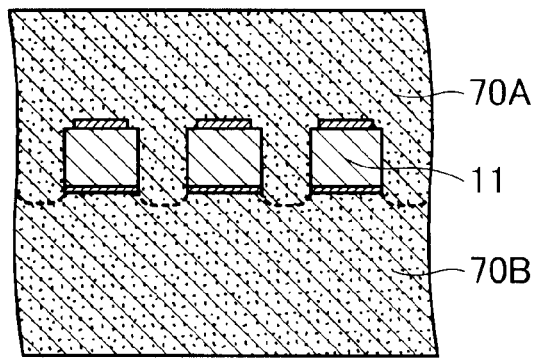

Next, as shown in FIG. 26D, a sealing portion 70A is formed by molding a resin to cover the semiconductor devices 11. The sealing portion 70A may also be formed by using a molding technique such as a molding with a liquid resin, transfer molding, and a compression molding technique.

Figure 27A:
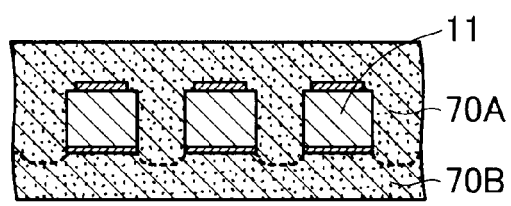

Next, as shown in FIG. 27A, the surfaces of the sealing portions 70A and 70B are polished to thin the work.

Figure 27B:
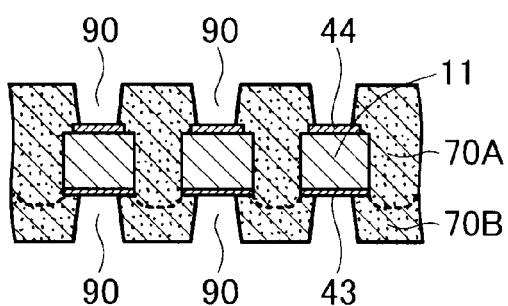

Next, as shown in FIG. 27B, holes 90 which reach the electrodes 43 and 44 are formed by boring the sealing portions 70A and 70B by laser or the like.

Figure 27C:
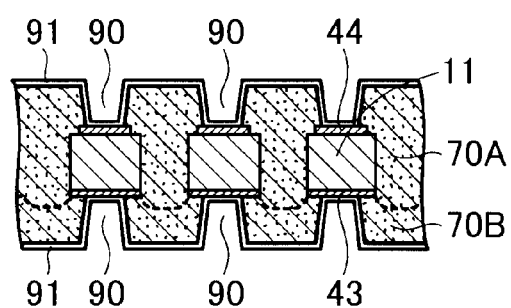

Next, as shown in FIG. 27C, the surface of the electrodes 43 and 44 which are exposed in the holes 90 are cleaned and a seed layer 91 made of metal such as copper is formed thereon by using a nonelectrolytic plating technique.

Figure 27D:
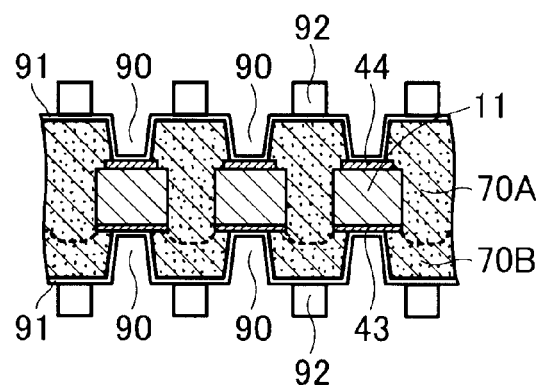

Next, as shown in FIG. 27D, resist pattern 92 is formed around on the surface of the sealing portions 70A and 70B around the holes 90.

Figure 28A:
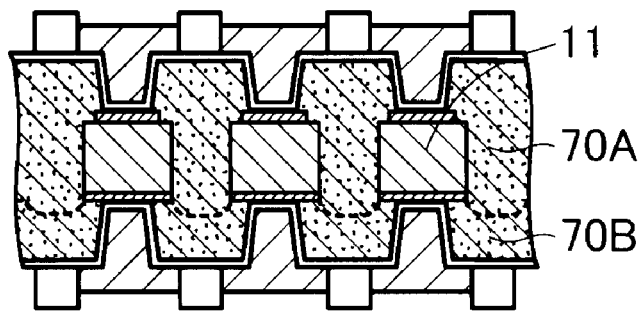

Next, as shown in FIG. 28A, external electrodes 82 and 83 are formed by plating metal such as copper by using an electrolytic plating technique.

Figure 28B:
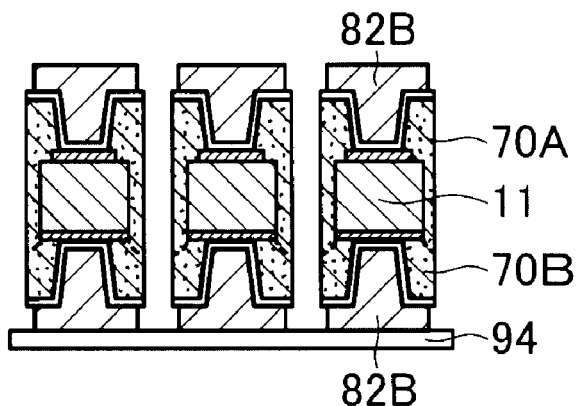

Next, as shown in FIG. 28B, resist pattern 92 is removed and the semiconductor apparatuses are separated by cutting the work which is attached on a dicing sheet 94 by using a blade dicer.

Figure 28C:
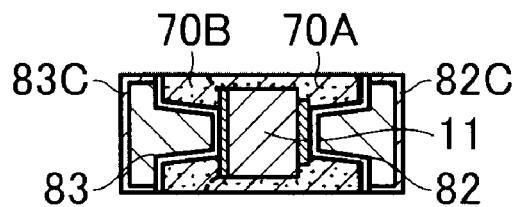

Next, as shown in FIG. 28C, the semiconductor apparatuses are removed from the dicing sheet 94 and plated layers 82C and 83C are formed on the surface of the external electrodes 82 and 83 by using a metal plating technique.

As described with reference to FIGS. 19A through 19D, the width (D1 in FIGS. 19A and 19C) of the sealing portion 70 may be larger than the width (D2 in FIGS. 19A and 19C) of the plated layers 82C and 83C, alternatively, the width of the sealing portion 70 may be smaller than the width of the plated layers 82C and 83C.

As explained above, according to the embodiment, a great number of compact semiconductor apparatuses are fabricated by performing the fabrication process to the semiconductor wafer 50.

The invention claimed is:

1. A method for manufacturing semiconductor apparatus comprising:
    forming first projections made of conductive material on each electrode of one semiconductor device for each of a plurality of semiconductor devices, the electrode being formed on a front surface of a semiconductor wafer;
    forming a first groove between the semiconductor devices on the front surface of the semiconductor wafer;
    forming a first sealing portion by filling the first groove and a gap between the first projections with insulating material;
    polishing a back surface of the semiconductor wafer;
    forming second projections made of conductive material on the back surface of the semiconductor wafer, the second projections being connected to the semiconductor device;
    forming a second sealing portion by filling a gap between the second projections by insulating material;
    forming a first lead made of conductive material on one of the first projections;
    forming a second lead made of conductive material on one of the second projections; and
    separating the semiconductor devices by cutting the first and second sealing portions between the semiconductor devices.

2. The method for manufacturing semiconductor apparatus according to claim 1, wherein the polishing the back surface of the semiconductor wafer 3. The method for manufacturing semiconductor apparatus according to claim 1, wherein at least one of the first and the second projections is formed by a plating.

4. The method for manufacturing semiconductor apparatus according to claim 1, wherein at least one of the first and the second leads is formed by a plating.

5. The method for manufacturing semiconductor apparatus according to claim 1, further comprising:
    plating metal on surfaces of the first and the second leads.

6. A method for manufacturing semiconductor apparatus comprising:
    forming a first projection made of conductive material on an electrode of one semiconductor device from a plurality of semiconductor devices, the electrode being formed on a front surface of a semiconductor wafer;
    forming a first sealing portion by covering the first projection with insulating material on the front surface of the semiconductor wafer;
    forming a second projection made of conductive material on a back surface of the semiconductor wafer, the second projection being connected to the one semiconductor device;
    separating the semiconductor devices by forming a first groove from the back surface of the semiconductor wafer between the semiconductor devices, the first groove reaching the first sealing portion,
    forming a second sealing portion by filling the first groove and by covering the second projection by insulating material;
    exposing the first projection by polishing a surface of the first sealing portion;
    exposing the second projection by polishing a surface of the second sealing portion; and
    splitting the semiconductor apparatus by cutting the first and second sealing portions between the semiconductor devices.

7. The method for manufacturing semiconductor apparatus according to claim 6, further comprising polishing the back surface of the semiconductor wafer before forming the second projection.

8. The method for manufacturing semiconductor apparatus according to claim 6, wherein at least one of the first and the second projections is formed by a plating.

9. The method for manufacturing semiconductor apparatus according to claim 6, wherein at least one of the first and the second leads is formed by a plating.

10. A method for manufacturing a semiconductor apparatus, the method comprising:
    forming a sealing portion on a side of at least one of a front surface and a back surface of a semiconductor device, the front surface being opposite to the back surface, each of the front surface and the back surface having an electrode;
    forming a hole reaching the electrode in the sealing portion;
    forming a conductive portion connecting to the electrode in the hole; and forming an external electrode at an end face of the sealing portion, the external electrode being connected to the end face of the conductive portion and including a cup shape electrode film extending to a side face of the sealing portion.

11. The method according to claim 10, wherein
the forming of the sealing portion includes sealing all of a plurality of the semiconductor devices,
the forming the hole includes forming the hole for each of the semiconductor devices,
the forming the conductive portion includes the conductive portion for each of the semiconductor devices, and
the forming the external electrode is performed after cutting the sealing portion in each of the semiconductor devices after the forming the hole and the forming the conductive portion, the forming external electrode includes forming the external electrode for each of the semiconductor devices.

12. The method according to claim 10, wherein
the forming of the sealing portion includes sealing all of a plurality of the semiconductor devices,
the forming the hole includes forming the hole for each of the semiconductor devices, and
the forming the conductive portion and forming the external electrode are performed after cutting the sealing portion in each of the semiconductor devices after forming the hole, the forming the conductive portion and forming the external electrode includes forming the conductive portion and forming the external electrode by metal plating.

13. The method according to claim 10, wherein
the forming of the sealing portion includes sealing each of a whole of the front surface and a whole of the back surface of the plurality of semiconductor devices,
the forming the hole includes forming the hole on each of the front surface and the back surface of each of the plurality of semiconductor devices, the forming the hole is followed by forming a groove in the sealing portion from the front surface to a middle of the sealing portion and a groove in the sealing portion from the back surface to a middle of the sealing portion for each of the semiconductor devices, and
the forming the conductive portion and forming the external electrode includes forming the conductive portion and the external electrode by metal plating and are followed by cutting the sealing portion at a position of the grooves.

14. A method for manufacturing a semiconductor apparatus, the method comprising:
forming a first sealing portion on a side of a back surface of a semiconductor wafer including a plurality of semiconductor devices formed on the semiconductor wafer;
forming a groove cutting the semiconductor wafer between the semiconductor devices and reaching the sealing portion;
forming a second sealing portion on a side of a front surface of the semiconductor wafer;
forming an opening in the first sealing portion reaching an electrode on the side of the back surface of the semiconductor device;
forming an opening in the second sealing portion reaching an electrode on the side of the front surface of the semiconductor devices;
forming a first projection by filling the opening formed in the first sealing portion with a conductive material and forming a first lead being connected with the electrode on the side of the back surface;
forming a second projection by filling the opening formed in the second sealing portion with a conductive material and forming a second lead being connected with the electrode on the side of the front surface; and
separating the semiconductor devices by cutting at least one of the first sealing portion and the second sealing portion.

15. The method according to claim 14, wherein
the forming the opening reaching the electrode on the side of the back surface of the semiconductor device includes forming the opening reaching the electrode on the side of the back surface of the semiconductor device by laser processing.

16. The method according to claim 14, further comprising:
decreasing a thickness of the first sealing portion prior to the forming the opening reaching the electrode on the side of the back surface of the semiconductor device.

17. The method according to claim 14, further comprising:
forming a seed layer in the opening formed in the first sealing portion prior to the forming the first projection.

18. The method according to claim 17, wherein the forming the seed layer includes forming the seed layer by nonelectrolytic plating.

19. The method according to claim 14, wherein the forming the first projection includes forming the first projection by electrolytic plating.

20. The method according to claim 14, wherein the electrode on the side of the front surface of the semiconductor devices is continuously formed on the side of the front surface of the semiconductor devices, the separating the semiconductor devices includes cutting the electrode on the side of the front surface of the semiconductor devices.

* * * * *